(12) United States Patent
Kim et al.

(10) Patent No.: US 10,192,937 B2
(45) Date of Patent: Jan. 29, 2019

(54) DISPLAY DEVICE

(71) Applicant: SAMSUNG DISPLAY CO., LTD., Yongin-si, Gyeonggi-do (KR)

(72) Inventors: Deuk Jong Kim, Yongin-si (KR); Ji Hye Heo, Yongin-si (KR); Za Il Lhee, Yongin-si (KR); Mi Na Jung, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/788,288

(22) Filed: Oct. 19, 2017

(65) Prior Publication Data

US 2018/0130856 A1 May 10, 2018

(30) Foreign Application Priority Data

Nov. 8, 2016 (KR) .................. 10-2016-0148199

(51) Int. Cl.
| | | |
|---|---|---|
| *H04L 27/00* | (2006.01) | |
| *H01L 27/32* | (2006.01) | |
| *G09G 3/3258* | (2016.01) | |
| *H01L 27/12* | (2006.01) | |
| *G09G 3/3233* | (2016.01) | |

(52) U.S. Cl.
CPC ...... *H01L 27/3218* (2013.01); *H01L 27/3276* (2013.01); *H01L 27/3279* (2013.01); *G09G 3/3233* (2013.01); *G09G 3/3258* (2013.01); *G09G 2300/0426* (2013.01); *G09G 2300/0452* (2013.01); *G09G 2320/0242* (2013.01); *H01L 27/124* (2013.01); *H01L 2251/5338* (2013.01)

(58) Field of Classification Search
CPC ............... H01L 27/124; H01L 27/3276; H01L 27/3218; H01L 27/3279
See application file for complete search history.

(56) References Cited

U.S. PATENT DOCUMENTS

| | | | |
|---|---|---|---|
| 7,710,529 B2* | 5/2010 | Park ...................... | G02F 1/1339 349/139 |
| 8,704,991 B2 | 4/2014 | Chang et al. | |
| 8,933,344 B2 | 1/2015 | Jeon | |
| 9,274,389 B2 | 3/2016 | Kang et al. | |
| 9,939,693 B2* | 4/2018 | Kwon ............... | G02F 1/134309 |

(Continued)

FOREIGN PATENT DOCUMENTS

| | | |
|---|---|---|
| KR | 101159318 B1 | 6/2012 |
| KR | 1020120136743 A | 12/2012 |

(Continued)

*Primary Examiner* — Ngan Ngo
(74) *Attorney, Agent, or Firm* — Cantor Colburn LLP

(57) ABSTRACT

A display device includes a substrate including a display area and a non-display area, a pixel unit provided in the display area, and including a first pixel column including a plurality of pixels and a second pixel column including a plurality of pixels displaying a different color from a color of the first pixel column, and data lines which are respectively connected to the first pixel column and the second pixel column, and respectively apply data signals to the first pixel column and the second pixel column, wherein the data line connected to the first pixel column includes sub lines and the data line connected to the second pixel column includes sub lines.

20 Claims, 23 Drawing Sheets

(56) References Cited

U.S. PATENT DOCUMENTS

| | | | |
|---|---|---|---|
| 2012/0140424 A1* | 6/2012 | Sato | G02F 1/167 |
| | | | 361/749 |
| 2013/0200404 A1* | 8/2013 | Lee | H01L 27/156 |
| | | | 257/88 |
| 2013/0229589 A1* | 9/2013 | Won | G02F 1/1368 |
| | | | 349/43 |
| 2014/0104532 A1* | 4/2014 | Cho | G02F 1/133377 |
| | | | 349/46 |
| 2015/0092131 A1* | 4/2015 | Lee | G02F 1/133377 |
| | | | 349/43 |
| 2015/0355516 A1* | 12/2015 | Imai | G02F 1/136227 |
| | | | 349/123 |
| 2016/0048045 A1* | 2/2016 | Imai | G02F 1/1337 |
| | | | 349/123 |
| 2016/0183382 A1 | 6/2016 | Solven et al. | |
| 2017/0184926 A1* | 6/2017 | Kwon | H01L 29/78606 |
| 2017/0255299 A1* | 9/2017 | Shimoshikiryoh | G06F 3/044 |
| 2018/0059449 A1* | 3/2018 | Kim | G02F 1/1309 |
| 2018/0083072 A1* | 3/2018 | Kwon | H01L 27/3262 |
| 2018/0092166 A1* | 3/2018 | Kim | H05B 33/04 |

FOREIGN PATENT DOCUMENTS

| | | |
|---|---|---|
| KR | 1020140045192 A | 4/2014 |
| KR | 1020180031866 A | 3/2018 |

* cited by examiner

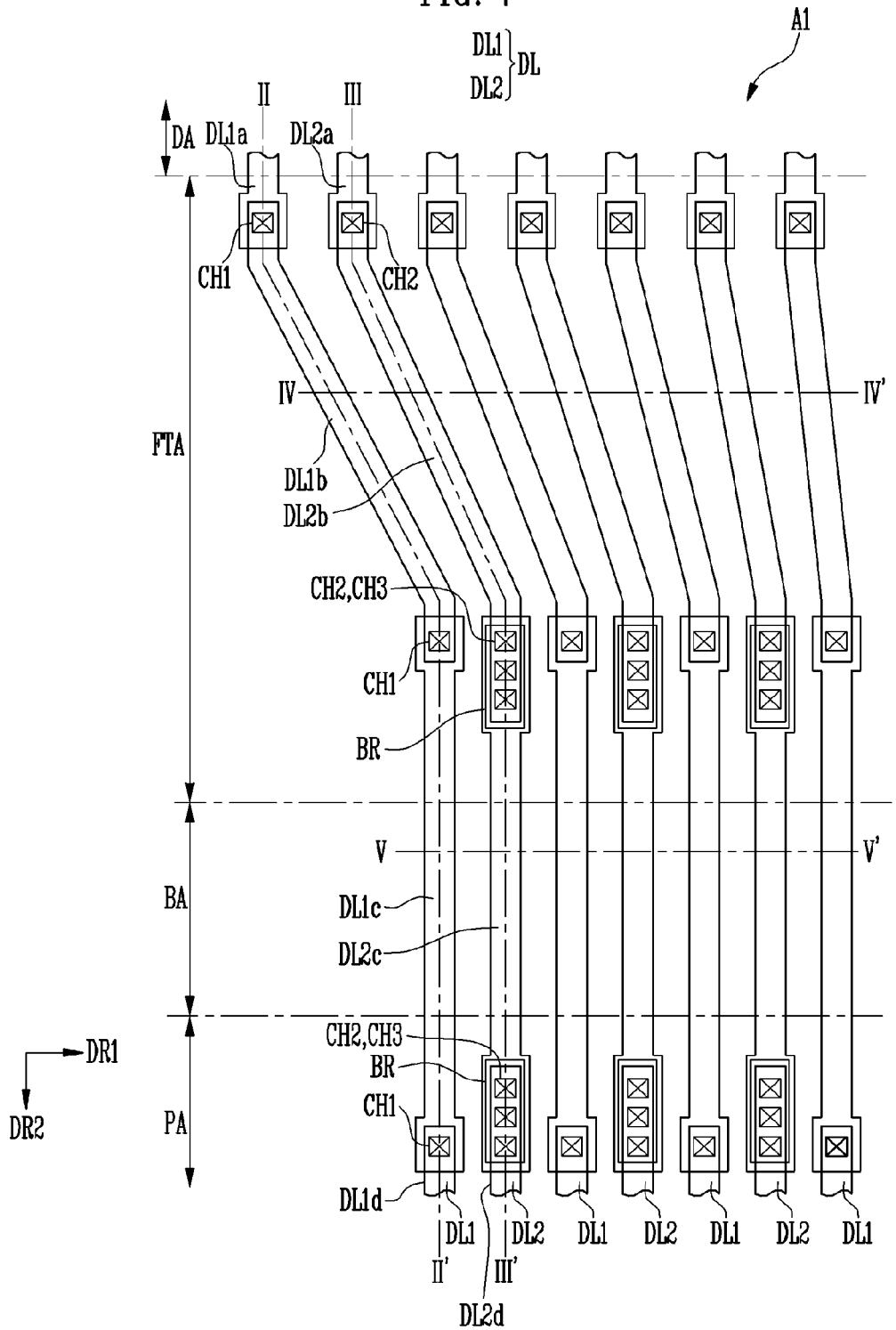

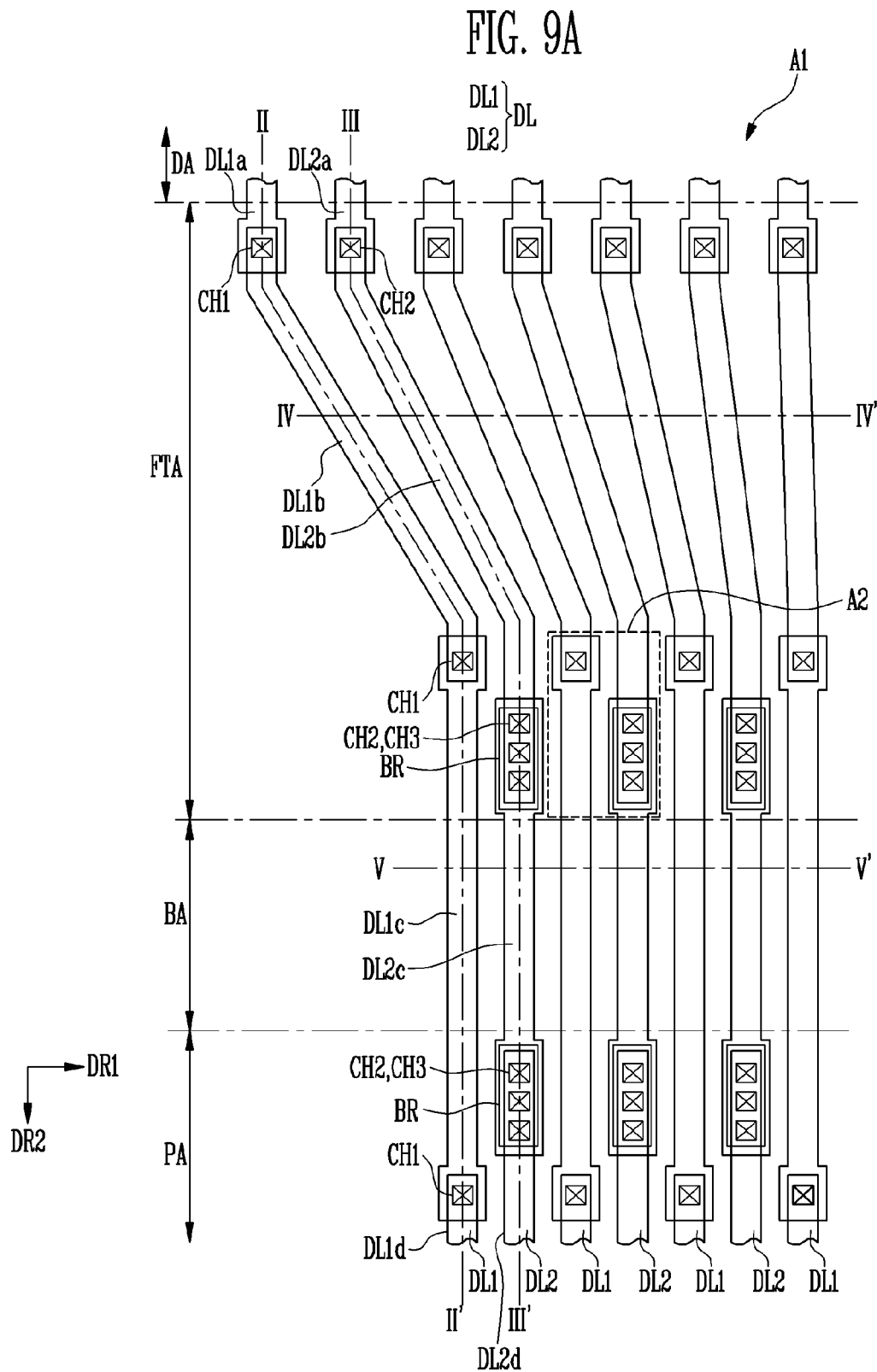

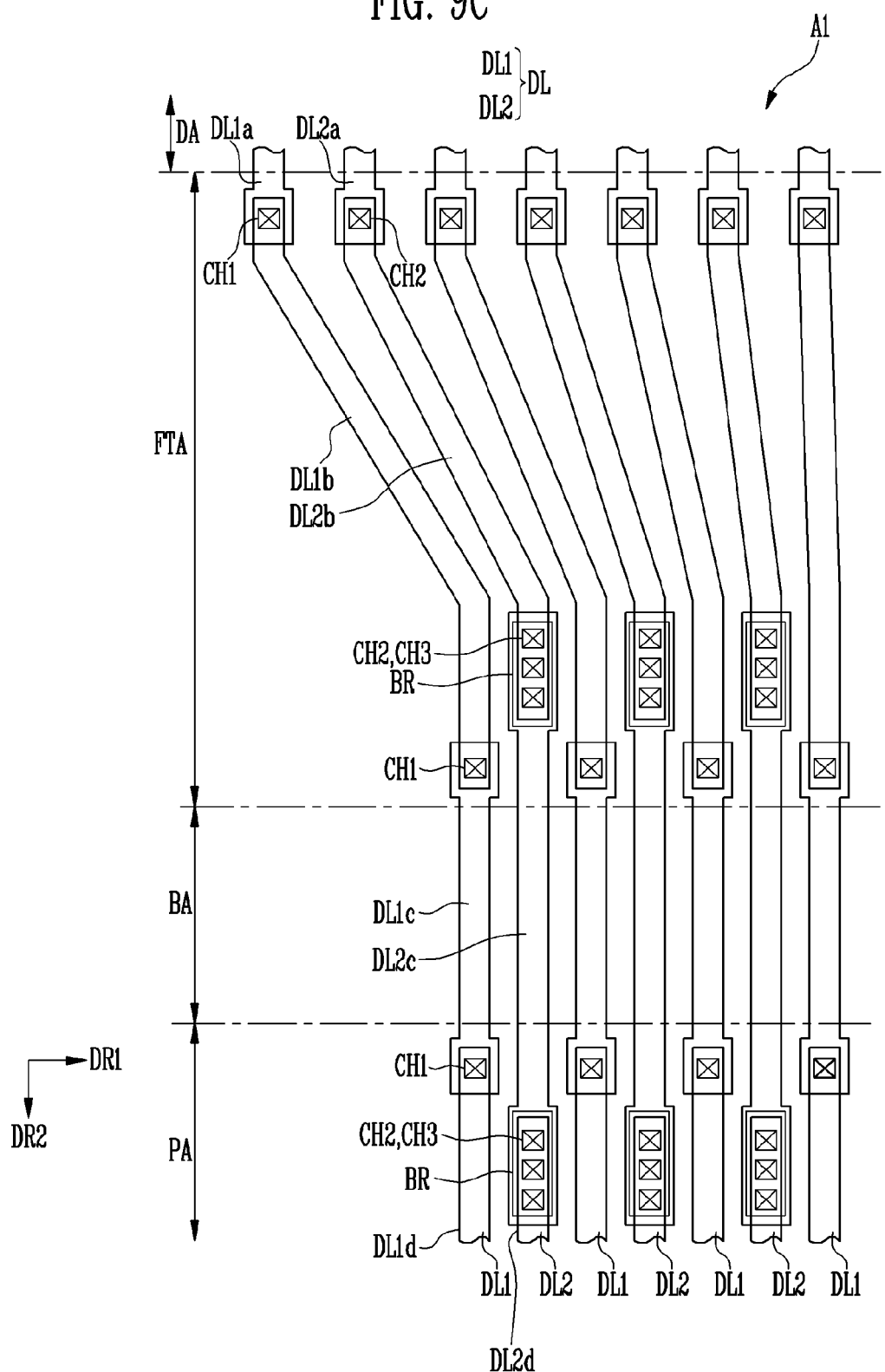

DISPLAY DEVICE

This application claims priority to Korean Patent Application No. 10-2016-0148199, filed on Nov. 8, 2016, and all the benefits accruing therefrom under 35 U.S.C. § 119, the content of which in its entirety is herein incorporated by reference.

BACKGROUND

1. Field

Exemplary embodiments of the invention relate to a display device.

2. Description of the Related Art

An organic light emitting display ("OLED") device displays an image by using an organic light emitting diode that is a self-emitting device, and has excellent luminance and color purity, thereby attracting attentions as a next-generation display device. The OLED device includes a plurality of pixels including red pixels, green pixels, and blue pixels, for example, and displays various color images through the pixels. The red pixels, the green pixels, and the blue pixels may be arranged in various forms, and are generally arranged in a stripe form. However, when the pixels are arranged in a stripe form, there is a problem in that an aperture is decreased by a black matrix positioned between the respective pixels and high resolution display performance is degraded. In order to overcome the aforementioned problem, a pentile matrix structure having high resolution is suggested.

SUMMARY

The invention has been made in an effort to solve the above-described problems associated with the prior art, and provides an organic light emitting display ("OLED") device, and more particularly, an OLED device having a pentile matrix structure.

An exemplary embodiment of the invention provides a display device, including: a substrate including a display area and a non-display area, a pixel unit provided in the display area, and including a first pixel column including a plurality of pixels and a second pixel column including a plurality of pixels displaying a different color from a color of the first pixel column, and data lines which are respectively connected to the first pixel column and the second pixel column, and respectively apply data signals to the first pixel column and the second pixel column. The data line connected to the first pixel column includes sub lines and the data line connected to the second pixel column includes sub lines, in the non-display area, the sub lines connected to the first pixel column are connected with one another through at least one contact hole, the sub lines connected to the second pixel column are connected with one another through at least one contact hole, and the sub lines connected to the second pixel column are connected through the at least one contact hole having a larger area than an area of the at least one contact hole, through which the sub lines connected to the first pixel column are connected with one another.

An exemplary embodiment of the invention provides a display device, including: a substrate including a display area and a non-display area, a pixel unit provided in the display area, and including a first pixel column including a plurality of pixels and a second pixel column including a plurality of pixels displaying a different color from a color of the first pixel column, and data lines which are respectively connected to the first pixel column and the second pixel column, and respectively apply data signals to the first pixel column and the second pixel column. The data line connected to the first pixel column includes sub lines and the data line connected to the second pixel column includes sub lines, in the non-display area, the sub lines connected to the first pixel column are connected with one another through at least one contact hole, the sub lines connected to the second pixel column are connected with one another through at least one contact hole, and the sub lines connected to the second pixel column are connected through a larger number of the at least one contact hole than a number of the at least one contact hole, through which the sub lines connected to the first pixel column are connected with one another.

In an exemplary embodiment, the first sub line and the second sub line may be connected with each other through a first contact hole provided between the first sub line and the second sub line, and the third sub line and the fourth sub line may be connected with each other through a second contact hole provided between the third sub line and the fourth sub line.

In an exemplary embodiment, an area of the second contact hole may be larger than an area of the first contact hole.

In an exemplary embodiment, a number of second contact holes may be larger than a number of first contact holes.

In an exemplary embodiment, the second data line may further include a bridge provided between the third and fourth sub lines.

In an exemplary embodiment, the first sub line and the second sub line may be connected with each other through a first contact hole provided between the first sub line and the second sub line, and the third sub line, the bridge, and the fourth sub line may be connected with one another through at least one second contact hole provided between the third sub line and the bridge and at least one third contact hole provided between the bridge and the fourth sub line.

In an exemplary embodiment, the second contact hole and the third contact hole may at least partially overlap in a plan view.

In an exemplary embodiment, an area of the second contact hole may be different from an area of the third contact hole. An area of the third contact hole may be larger than an area of the second contact hole.

In an exemplary embodiment, a number of second contact holes may be larger than a number of third contact holes.

In an exemplary embodiment, a number of third contact holes may be larger than a number of second contact holes.

In an exemplary embodiment, the display device may further include first to fourth insulating layers sequentially stacked on the substrate, in which the data lines may include first data lines connected to the first pixel column and second data lines connected to the second pixel column, and at least a part of the first data lines and the second data lines may be provided on at least two layers among the first to fourth insulating layers.

In an exemplary embodiment, the non-display area may include a fan-out area, a bent area, and a pad area sequentially disposed from the display area. In the fan-out area, a first data line of the first data lines may be provided on one of the first and second insulating layers, and a second data line of the second data lines may be provided on a remainder of the first and second insulating layers.

In an exemplary embodiment, the display device may further include a bent insulating layer provided in the bent area, in which an opening is defined in the first to third insulating layers, and the bent insulating layer may be provided in the opening.

In an exemplary embodiment, in the bent area, the first data line may be provided on the bent insulating layer, and the second data line may be provided on the fourth insulating layer.

In an exemplary embodiment, the first to third insulating layers may include an inorganic material, and the fourth insulating layer may include an organic material.

According to the exemplary embodiments of the invention, it is possible to provide the display device, in which a deviation of resistance of data signals in the first data line and the second data line is matched with the pixels, so that a vertical line defect is decreased.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this invention will be thorough and complete, and will fully convey the scope of the example embodiments to those skilled in the art.

FIG. 7 is a plan view illustrating the exemplary embodiment of data lines in a portion corresponding to A1 of FIG. 2 in the display device according to the invention.

FIGS. 9A to 9C are plan views illustrating the exemplary embodiment of data lines in a portion corresponding to A1 of FIG. 2 in the display device according to the invention.

DETAILED DESCRIPTION OF THE INVENTION

Figure 1:
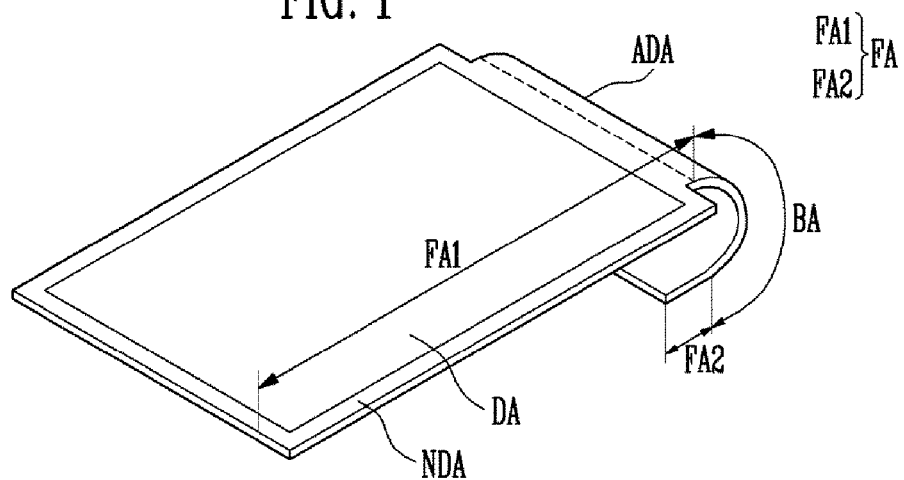
FIG. 1 is a perspective view illustrating an exemplary embodiment of a display device according to the invention.

The disclosure may be variously modified and have various forms, so that specific exemplary embodiments will be illustrated in the drawings and described in detail in the text. However it should be understood that the invention is not limited to the specific embodiments, but includes all changes, equivalents, or alternatives which are included in the spirit and technical scope of the disclosure.

In the drawings, dimensions may be exaggerated for clarity of illustration. It will be understood that when an element is referred to as being "between" two elements, it can be the only element between the two elements, or one or more intervening elements may also be present. Like reference numerals refer to like elements throughout.

In the description of respective drawings, similar reference numerals designate similar elements. In the accompanying drawings, sizes of structures are illustrated to be enlarged compared to actual sizes for clarity of the disclosure. Terms "first", "second", and the like may be used for describing various constituent elements, but the constituent elements should not be limited to the terms. The terms are used only to discriminate one constituent element from another constituent element. In an exemplary embodiment, a first element could be termed a second element, and similarly, a second element could be also termed a first element, for example, without departing from the scope of the disclosure. As used herein, the singular forms are intended to include the plural forms as well, unless the context clearly indicates otherwise.

In the disclosure, it should be understood that terms "include" or "have" indicates that a feature, a number, a step, an operation, a component, a part or the combination thoseof described in the specification is present, but do not exclude a possibility of presence or addition of one or more other features, numbers, steps, operations, components, parts or combinations, in advance. It will be understood that when an element such as a layer, film, region, or substrate is referred to as being "on" another element, it can be directly on the other element or intervening elements may also be present. Further, in the disclosure, when a part of a layer, a film, an area, a plate, and the like is formed on another part, a direction, in which the part is formed, is not limited only to an up direction, and includes a lateral direction or a down direction. On the contrary, it will be understood that when an element such as a layer, film, region, or substrate is referred to as being "beneath" another element, it can be directly beneath the other element or intervening elements may also be present.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. In an exemplary embodiment, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Hereinafter, an exemplary embodiment of the invention will be described in detail in further detail with reference to the accompanying drawings.

Figure 2:
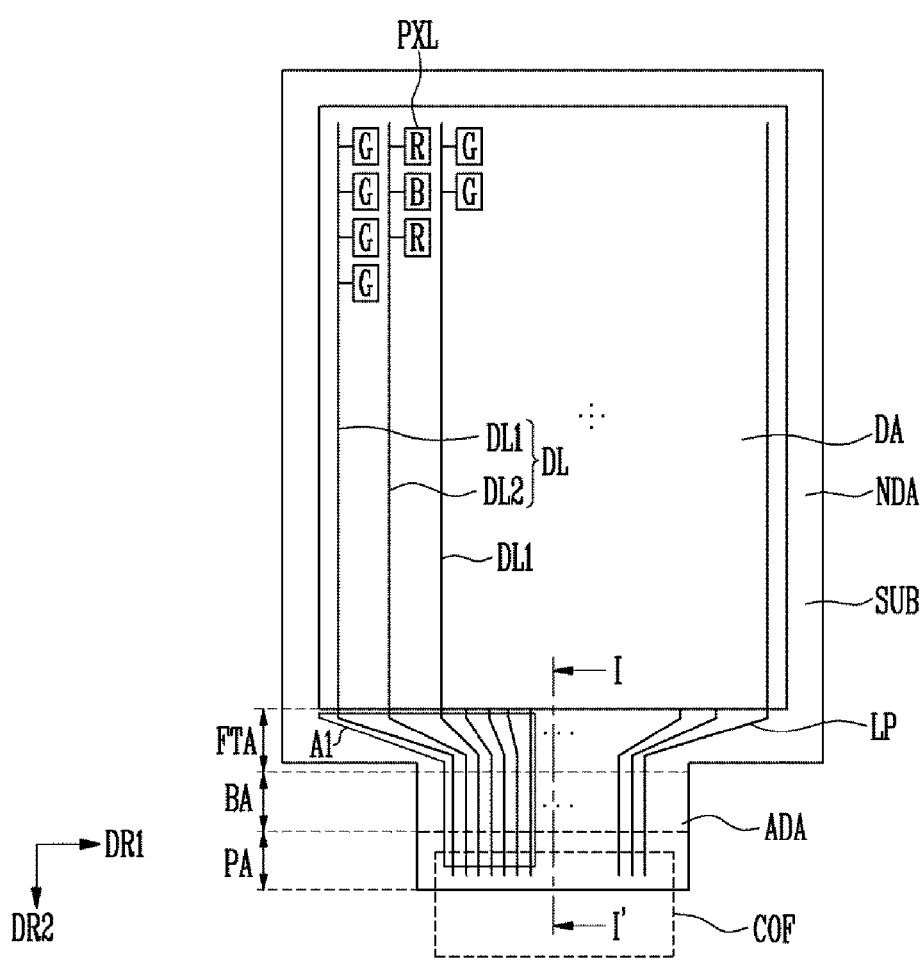
FIG. 2 is a plan view illustrating the display device of FIG. 1.

FIG. 1 is a perspective view illustrating a display device according to an exemplary embodiment of the invention, and FIG. 2 is a plan view illustrating the display device of FIG. 1.

Referring to FIGS. 1 and 2, a display device according to an exemplary embodiment of the invention includes a substrate SUB, pixels PXL provided on the substrate SUB, and a line part LP connected to the pixels PXL.

The substrate SUB includes a display area DA and a non-display area NDA provided at least one side of the display area DA.

The substrate SUB may have an approximate square shape, particularly, a rectangular shape. In the exemplary embodiment of the invention, the substrate SUB may include a pair of short sides parallel to each other in a first direction DR1, and a pair of long sides parallel to each other in a second direction DR2.

However, the shape of the substrate SUB is not limited thereto, and the substrate SUB may have various shapes. In an exemplary embodiment, the substrate SUB may be provided in various shapes, such as a polygon having a closed shape including a straight side, a circle and an ellipse including a curved side, and a semicircle and a half ellipse including a side including a straight line and a curved line, for example. In the exemplary embodiment of the invention, when the substrate SUB has a straight side, at least a part of the corners of each shape may have a curved line. In an exemplary embodiment, when the substrate SUB has the rectangular shape, a portion, in which the adjacent straight sides meet, may be replaced with a curve line having a predetermined curvature, for example. That is, in a vertex portion of the rectangular shape, both adjacent ends may be connected to two adjacent straight sides and may include curve sides having a predetermined curvature. The curvature may be differently set according to a position. In an exemplary embodiment, the curvature may be changed according to a start position of the curve line, a length of the curve line, and the like, for example.

The display area DA is an area, in which the plurality of pixels PXL is provided and an image is displayed. The display area DA may be provided in a shape corresponding to a shape of the substrate SUB. In an exemplary embodiment, the display area DA may be provided in various shapes, such as a polygon having a closed shape including a straight side, a circle and an ellipse including a curved side, and a semicircle and a half ellipse including a side including a straight line and a curved line, for example, like the shape of the substrate SUB. In the exemplary embodiment of the invention, when the display area DA has a straight side, at least a part of the corners of each shape may have a curved line.

The pixels PXL are disposed in the display area DA of the substrate SUB. Each pixel PXL is a minimum unit displaying an image, and the plurality of pixels PXL may be provided. The pixels PXL may emit white light and/or color light. In an exemplary embodiment, each pixel PXL may emit any one of red, green, and blue, but is not limited thereto, and may emit another color, such as cyan, magenta, and yellow.

The pixels PXL may be light emitting devices including organic layers, but are not limited thereto, and may be implemented in various forms, such as liquid crystal devices, electrophoretic devices, electrowetting devices, as long as a concept of the invention is maintained.

In the exemplary embodiment of the invention, the non-display area NDA may further include an additional area ADA protruding from a part of the non-display area NDA. The additional area ADA may protrude from sides of the non-display area NDA. In the exemplary embodiment of the invention, the case where the additional area ADA protrudes from a side corresponding to one of the short sides of the substrate SUB is disclosed. However, the invention is not limited thereto, and the additional area ADA may protrude from one side among the long sides of the substrate SUB, or may be provided in a form protruding from two or more sides among the four sides. In an exemplary embodiment of the invention, a data driver may be provided or connected to the additional area ADA, but the invention is not limited thereto, and various constituent elements may be disposed in the additional area ADA.

In the exemplary embodiment of the invention, at least a part of the display device of the invention may have flexibility, and the display device of the invention may be bent in a portion having flexibility. That is, the display device may have a bent area BA bent in one direction, and a flat area FA, which is provided at least one side of the bent area BA, is not bent, and is flat. The flat area FA may have flexibility or may not have flexibility.

In the exemplary embodiment of the invention, the case where the bent area BA is provided in the additional area ADA is illustrated as an example. According to the exemplary embodiment of the invention, a first flat area FA1 and a second flat area FA2, which are spaced apart from each other, may be provided with the bent area BA interposed therebetween, and the first flat area FA1 may include the display area DA. In the exemplary embodiment of the invention, the bent area BA may be spaced apart from the display area DA.

In the bent area BA, when it is assumed that a line, along which the display device is bent, is referred to as a folding line, the folding line is provided within the bent area BA. Here, the term "bent" means that a form is not fixed, but is transformable from an original form to another form, and includes the case where the display device is folded, curved, or rolled in a scroll type along one or more specific lines, that is, the folding line. Accordingly, in the exemplary embodiment of the invention, it is illustrated that the state where one surfaces of the two flat areas FA1 and FA2 are positioned in parallel to each other and are folded so as to face each other, but the invention is not limited thereto, and the surfaces of the two flat areas FA1 and FA2 may also be folded with a predetermined angle (for example, an acute angle, a right angle, or an obtuse angle) with the bent area BA interposed therebetween.

In the exemplary embodiment of the invention, the additional area ADA may be bent along the folding line, and in this case, the additional area ADA is bent, so that it is possible to decrease a width of a bezel.

Figure 3A:
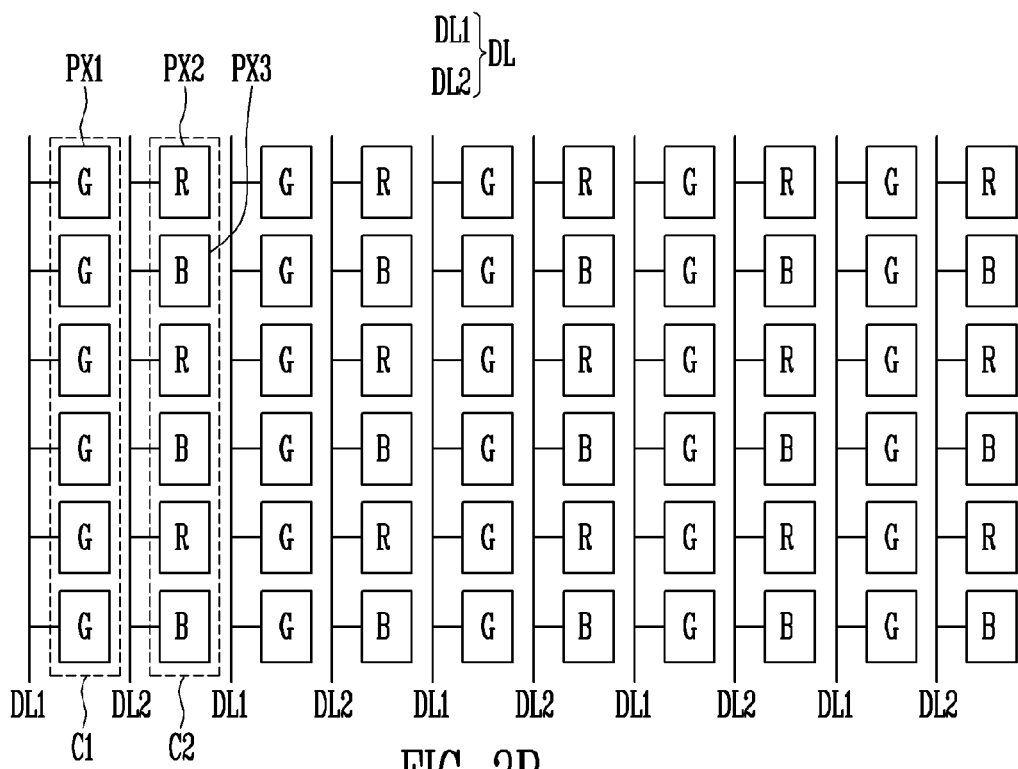
FIGS. 3A and 3B are plan views illustrating an exemplary embodiment of a pixel unit disposed in a display area in the display device according to the invention.
Figure 3B:
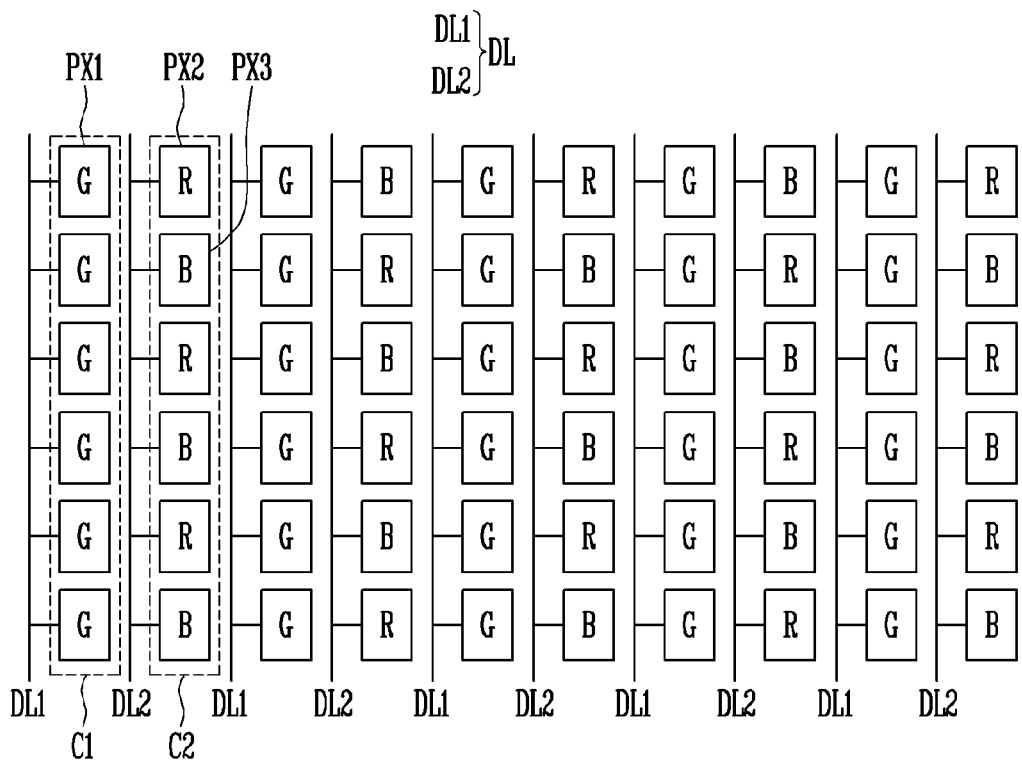

FIGS. 3A and 3B are plan views illustrating a pixel unit disposed in the display area in the display device according to the exemplary embodiment of the invention.

Referring to FIGS. 2, 3A, and 3B, the display device according to the exemplary embodiment of the invention includes a pixel unit displaying an image, and the pixel unit includes the plurality of pixels PXL.

In the illustrated exemplary embodiment of the invention, the pixels PXL may be arranged in a matrix form along a row extended in the first direction DR1 and a column extended in the second direction DR2. However, the arrangement form of the pixels PXL is not particularly limited, and the pixels PXL may be arranged in various forms. In an exemplary embodiment, the pixels PXL may be arranged in the row direction, or may be arranged so that a direction inclined to a predetermined direction is the row direction, for example.

The pixels PXL includes first pixels PX1 displaying a first color, second pixels PX2 displaying a second color, and third pixels PX3 displaying a third color.

In the exemplary embodiment of the invention, the first color may be a green color, the second color may be a red color, and the third color may be a blue color. However, the first to third colors are not limited thereto, and may have other colors.

The first pixels PX1 are disposed in the column direction to define a first pixel column C1. That is, in the first pixel column C1, the pixels are disposed in an order of the first pixel PX1, the first pixel PX1, the first pixel PX1, and so on. The second pixels PX2 and the third pixels PX3 are alternately disposed in the column direction to form a second pixel column C2. That is, in the second pixel column C2, the pixels are disposed in an order of the second pixel PX2, the third pixel PX3, the second pixel PX3, the third pixel PX3, and so on.

In the exemplary embodiment of the invention, the pixel arrangement order of the second pixel column C2 may be changed. In an exemplary embodiment, in one of the second pixel column C2, the pixels are disposed in an order of the second pixel PX2, the third pixel PX3, the second pixel PX3, the third pixel PX3, and so on, and in the other of the second pixel column C2, the pixels are disposed in an order of the third pixel PX3, the second pixel PX2, the third pixel PX3, the second pixel PX2, and so on. Accordingly, in the exemplary embodiment of the invention, the pixels may be disposed in the order of the first pixel PX1, the second pixel PX2, the first pixel PX1, the second pixel PX2, and so on, in the row direction as illustrated in FIG. 3A, or in the order of the first pixel PX1, the second pixel PX2, the first pixel PX1, the third pixel PX3, and so on, as illustrated in FIG. 3B. In another embodiment of the invention, the pixels may be disposed in the order of the first pixel PX1, the third pixel PX3, the first pixel PX1, the second pixel PX2, and so on, in the row direction.

The numbers of first pixels columns C1 and second pixel columns C2 are plural, and are alternately disposed along the row direction. Accordingly, in a predetermined row, the first pixels PX1 and the second pixels PX2 may be alternately disposed in the $n^{th}$ row, where n is a natural number. That is, in the $n^{th}$ row, the pixels may be disposed in the order of the first pixel PX1, the second pixel PX2, the first pixel PX1, the second pixel PX2, the first pixel PX1, and so on. In the $n-1^{th}$ row or the $n+1^{th}$ row, the first pixels PX1 and the third pixels PX3 may be alternately disposed. That is, in the $n-1^{th}$ row or the $n+1^{th}$ row, the pixels may be disposed in the order of the first pixel PX1, the third pixel PX3, the first pixel PX1, the third pixel PX3, the first pixel PX1, and so on.

Each pixel column is connected to a data line DL. The pixels PXL of the first pixel column C1 are connected to a first data line DL1. That is, the first pixels PX1 of the first pixel column C1 are connected to the first data line DL1. The pixels PXL of the second pixel column C2 are connected to a second data line DL2. That is, the second pixels PX2 and the third pixels PX3 of the second pixel column C2 are connected to the second data line DL2. Accordingly, the first data lines DL1 and the second data lines DL2 are also alternately disposed in the row direction like the first pixel columns C1 and the second pixel columns C2.

The arrangement structure of the first to third pixels PX1 to PX3 corresponds to a pentile matrix pixel structure. The pentile matrix pixel structure in the exemplary embodiment of the invention adopts rendering driving, which shares an adjacent pixel PXL and displays a color, thereby implementing high resolution with the small number of pixels PXL.

In the illustrated exemplary embodiment of the invention, it is described that each first pixel PX1, each second pixel PX2, and each third pixel PX3 may have the same area, but the invention is not limited thereto. Areas of at least two pixels PXL among the first pixel PX1, the second pixel PX2, and the third pixel PX3 may be different from each other. All of the first pixel PX1, the second pixel PX2, and the third pixel PX3 may be provided with different areas, and areas of any two pixels PXL may be the same as each other, and an area of the remaining pixel may be different. In an exemplary embodiment, an area of the third pixel PX3 displaying a blue color as the third color may be larger than an area of the second pixel PX2 displaying a red color as the second color and/or the first pixel PX1 displaying a green color as the first color, for example. In another exemplary embodiment, the areas of the second pixel PX2 and the third pixel PX3 are the same as each other, and the area of the first pixel PX1 may be smaller than the areas of the second pixel PX2 and the third pixel PX3.

Figure 4:
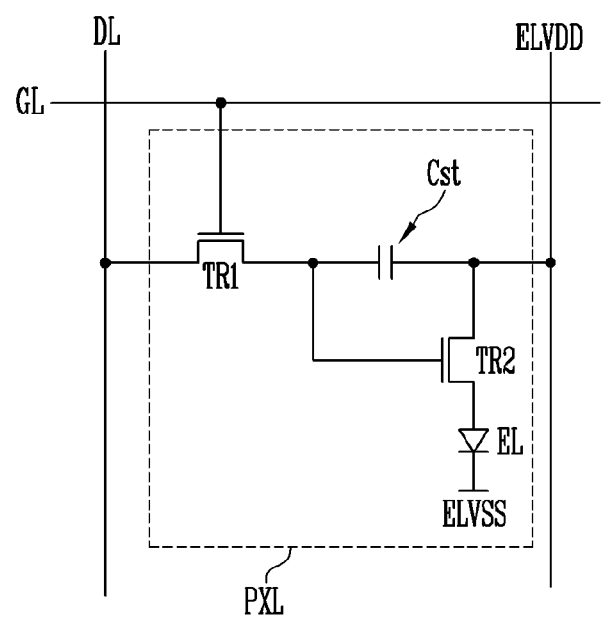
FIG. 4 is an equivalent circuit diagram illustrating an exemplary embodiment of the case where a pixel according to the invention is a light emitting device.

FIG. 4 is an equivalent circuit diagram illustrating the case where the pixel PXL according to an exemplary embodiment of the invention is a light emitting device.

Referring to FIG. 4, each pixel PXL includes a thin film transistor ("TFT") connected to the line part LP (refer to FIG. 2), a light emitting device EL connected to the TFT, and a capacitor Cst.

The TFT may include a driving TFT TR2 for controlling the light emitting device EL and a switching TFT TR1 for switching the driving TFT TR2. In the exemplary embodiment of the invention, the case where one pixel PXL includes the two TFTs TR1 and TR2 is described, but the invention is not limited thereto, and one pixel PXL may include one TFT and a capacitor, or one pixel PXL may include three or more TFTs and two or more capacitors. In an exemplary embodiment, one pixel PXL may include seven TFTs, a light emitting device, and a storage capacitor.

The switching TFT TR1 includes a gate electrode, a source electrode, and a drain electrode. In the switching TFT TR1, the gate electrode is connected to a gate line and the source electrode is connected to the data line DL. The drain electrode is connected to a gate electrode of the driving TFT TR2. The switching TFT TR1 transmits a data signal applied to the data line DL to the driving TFT TR2 according to a scan signal applied to the gate line.

The driving TFT TR2 includes the gate electrode, a source electrode, and a drain electrode. In the driving TFT TR2, the gate electrode is connected to the switching TFT TR1, the source electrode is connected to a first power source line ELVDD, and the drain electrode is connected to the light emitting device EL.

The light emitting device EL includes an emission layer, and a first electrode and a second electrode, which face each other with the emission layer interposed therebetween. The first electrode is connected to the drain electrode of the driving TFT TR2. The second electrode is connected to a second power source line ELVSS, so that a common voltage is applied thereto. The emission layer emits light according to an output signal of the driving TFT TR2 and displays an image by emitting light or emitting no light. Here, the light emitted from the emission layer may be changed according to a material of the emission layer, and may be color light or white light.

The capacitor Cst is connected between the gate electrode and the source electrode of the driving TFT TR2, and charges and maintains a data signal input to the gate electrode of the driving TFT TR2.

Referring back to FIGS. 1 to 4, the non-display area NDA is an area, in which the pixels PXL are not provided, and is an area, in which an image is not displayed.

The non-display area NDA may include a fan-out area FTA positioned between the display area DA and the bent area BA, and a pad area PA positioned at an external side of the bent area BA. Accordingly, the display area DA, the fan-out area FTA, the bent area BA, and the pad area PA are sequentially disposed.

The fan-out area FTA is a portion, in which the line part LP of the display area DA is extended to the bent area BA. The lines extended from the display area DA in the second direction DR2 are provided in a fan shape, in which an interval of the lines is gradually decreased, in the fan-out area FTA. The line part LP may include various kinds of lines, and the kind is not limited. In an exemplary embodiment, the line part LP provides a signal to each pixel PXL, and may include a gate line, a data line DL, a first power source line, a second power source line, and the like, and may further include other lines as necessary, for example.

In an exemplary embodiment of the invention, the case where the lines of the line part LP are the data lines DL is described as an example.

In an exemplary embodiment of the invention, the data lines DL may generally be extended in the second direction DR2 in the display area DA, and may be spaced apart from one another. The data lines DL may have gradually decreased or increased distances with the adjacent data lines DL in the second direction DR2. In an exemplary embodiment of the invention, the data lines DL may have gradually decreased distances with the adjacent data lines DL in the fan-out area FTA in the second direction DR2.

The bent area BA is a portion, in which the line part LP from the fan-out area FTA is extended to the pad area PA. The lines extended from the fan-out area FTA in the second direction DR2 are extended in parallel in the bent area BA in the second direction DR2.

The pad area PA is an area, which overlaps the second flat area FA2, and in which contact electrodes connecting the lines of the line part LP to a driver are provided. The lines extended from the bent area BA in the second direction DR2 may be extended even in the pad area PA in the second direction DR2, and the contact electrodes are provided at an end portion of the pad area PA.

Accordingly, the data lines DL may be provided over the display area DA and the non-display area NDA, and are finally connected to a driver (not illustrated). The driver may be connected to an end portion of the line part LP. The driver provides a signal to each pixel PXL through the data lines DL, thereby controlling the driving of each pixel PXL.

The driver may include a scan driver (not illustrated) providing a scan signal to each pixel PXL along the gate line, a data driver (not illustrated) providing a data signal to each pixel PXL along the data lines DL, and a timing controller (not illustrated) controlling the scan driver and the data driver.

In an exemplary embodiment of the invention, the scan driver may be directly disposed (e.g., mounted) on the substrate SUB. When the scan driver is directly disposed (e.g., mounted) on the substrate SUB, the scan driver may be provided at the same time during a process of forming the pixels PXL. However, a provided position or a providing method of the scan driver are not limited thereto, and the scan driver may be provided in a separate chip and provided on the substrate SUB in a form of chip on glass, or may be disposed (e.g., mounted) on a printed circuit board ("PCB") and connected to the substrate SUB through a connecting member.

In an exemplary embodiment of the invention, the data driver may be directly disposed (e.g., mounted) on the substrate SUB, but is not limited thereto, and the data driver may be provided in a separate chip and connected onto the substrate SUB. In an exemplary embodiment of the invention, when the data driver is provided in the separate chip and is connected onto the substrate SUB, the data driver may be provided in a form of chip-on-glass or chip-on-plastic. In another exemplary embodiment, the data driver may be disposed (e.g., mounted) on a PCB and connected to the substrate SUB through a connecting member. In an exemplary embodiment of the invention, the data driver may be manufactured in a form of a chip on film ("COF") and connected to the substrate SUB.

Figure 5:
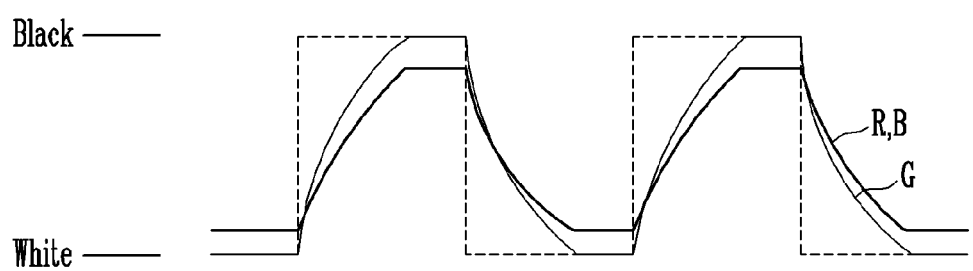
FIG. 5 is a diagram illustrating a waveform of a data voltage applied to each pixel.

FIG. 5 is a diagram illustrating a waveform of a data voltage applied to each pixel, and the description will be provided with reference to FIG. 5 below.

A swing width of a data voltage applied to each pixel may be different according to a color of light emitted by the pixel. In an exemplary embodiment, a swing width of a data voltage of the red pixel R may be larger than a swing width of a data voltage of the green pixel G, for example. Further, a swing width of a data voltage of the blue pixel B may be larger than a swing width of a data voltage of the green pixel G. In an exemplary embodiment of the invention, the swing widths of the data voltages of the red pixel R and the blue pixel B may be about 3 volts (V) or more, and a swing width of the data voltage of the green pixel G may be, for example, less than about 3 V, for example. Accordingly, as illustrated in FIG. 5, when the data voltage is applied to a green pixel G through the first data line, the data voltage may not be sufficiently charged compared to the case where the voltages is applied to a red pixel R and a blue pixel B through the second data line. When the data voltage is not sufficiently charged in the red pixel R and the blue pixel B, luminance of red and blue is decreased, so that a vertical line defect or a greenish defect is generated in the pixel column corresponding to red and blue.

In an exemplary embodiment of the invention, resistance of the second data line DL2 connected to the red pixel R and the blue pixel B, of which the data voltages have the large swing width, is provided to be relatively low, and resistance of the first data line DL1 connected to the green pixel G, of which the data voltage has the small swing width, is provided to be relatively high. To this end, the contact structures of the first and second data lines DL1 and DL2 in the non-display area NDA are differently provided, thereby uniformly matching resistance between the respective pixels. Accordingly, it is possible to prevent non-uniform color development between the respective pixel columns. The contract structures of the first and second data lines DL1 and DL2 will be described below.

In an exemplary embodiment of the invention, the case where the pixels displaying the first to third colors are the green, red, and blue pixels R, G and B is described as an example, but the invention may be applied to the pixel of other colors within the limit without departing form the concept of the invention. Further, in the illustrated exemplary embodiment, the case where the swing widths of the data voltages of the red pixel R and the blue pixel B are larger than the swing width of the data voltage of the green pixel G is disclosed as an example, but this is for convenience of the description, and the swing width of the data voltage according to the color may be different from the aforementioned swing widths. The invention may be applied to the case where, even in the case of the pixel of another color, a defect is generated due to a swing width of the data voltage, a difference in resistance of the data lines, a signal delay according to the resistance difference, and the like.

Figure 6:
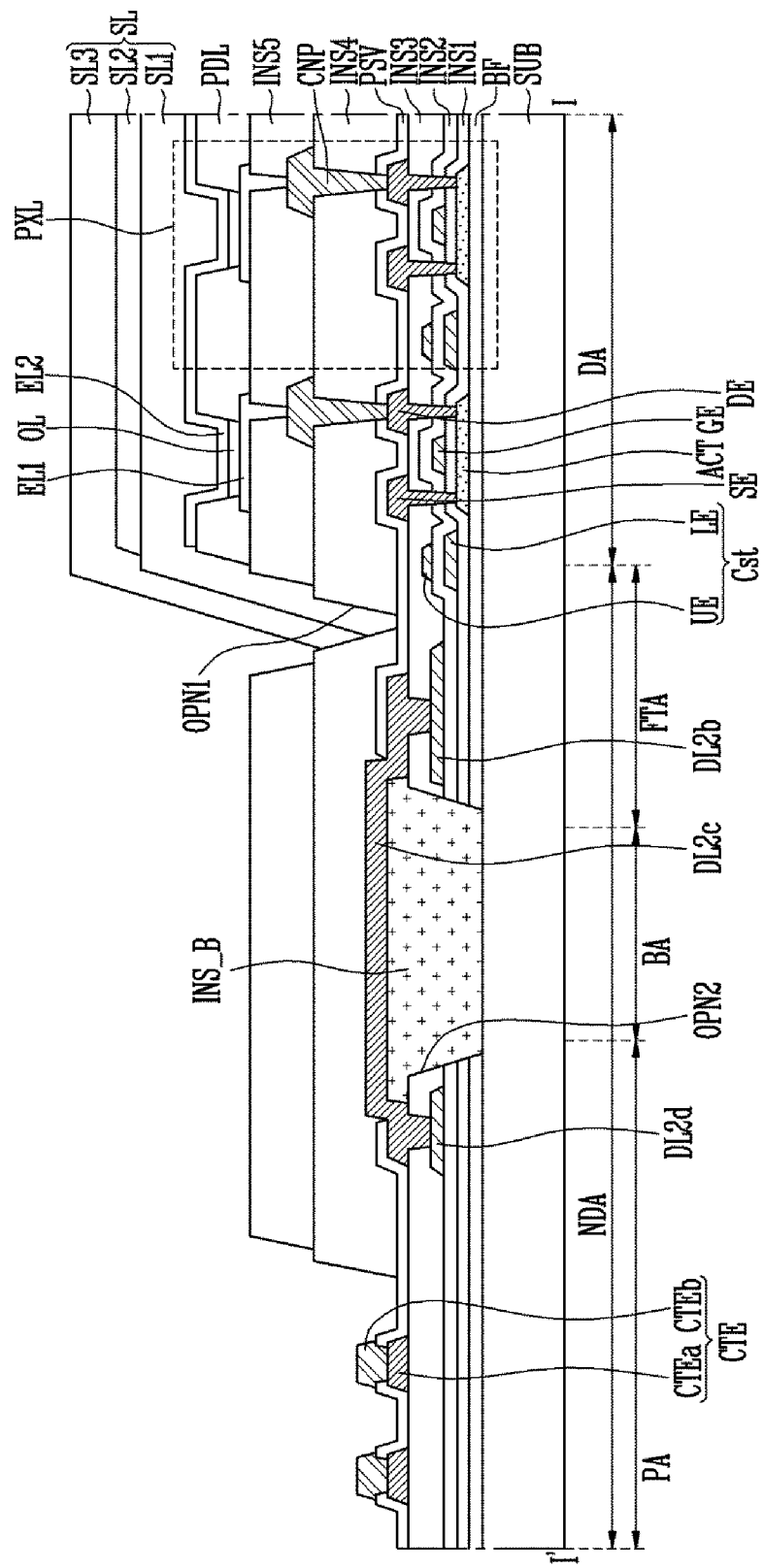
FIG. 6 is a cross-sectional view taken along line I-I' of FIG. 2, and illustrates some of the pixels in the display area and a non-display area.

FIG. 6 is a cross-sectional view taken along line I-I' of FIG. 2, and illustrates some of the pixels in the display area DA and the non-display area NDA. FIG. 6 conceptually illustrates the display device according to an exemplary embodiment of the invention, and for convenience of the description, some elements may be exaggerated or reduced.

The display device according to an exemplary embodiment of the invention has a bent part as illustrated in FIG. 1, but FIG. 6 illustrates the display device, which is not bent, for convenience of the description. For reference, in the cross-sectional views or the plan views for exemplary embodiments to be described below, the state, in which the display device is not bent, is illustrated for convenience of the illustration.

Hereinafter, the display device according to an exemplary embodiment of the invention will be described in detail with reference to FIGS. 1 to 6.

The display area DA will be first described, and then the non-display area NDA will be described.

In an exemplary embodiment of the invention, the plurality of pixels PXL is provided in the display area DA. Each pixel PXL includes a transistor connected to a corresponding line in the line part LP, the light emitting device connected to the transistor, and the capacitor Cst. The transistor may include a driving transistor for controlling the light emitting device, and a switching transistor for switching the driving transistor.

The pixels PXL according to an exemplary embodiment of the invention are provided on the substrate SUB.

The substrate SUB may include an insulating material, such as glass and resin. Further, the substrate SUB may include a material having flexibility so as to be bendable or foldable, and may have a single-layer structure of a multi-layer structure.

In an exemplary embodiment, the substrate SUB may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate, for example. However, the material of the substrate SUB may be variously changed, and the substrate SUB may include fiber glass reinforced plastic ("FRP"), and the like, for example.

A buffer layer BF is provided on the substrate SUB. The buffer layer BF prevents impurities from being diffused to the switching and driving transistors. The buffer layer BF may be provided in a single layer, but may also be provided in multiple layers including two or more layers.

The buffer layer BF may be an inorganic insulating layer including an inorganic material. In an exemplary embodiment, the buffer layer BF may include a silicon nitride, a silicon oxide, a silicon oxynitride, and the like, for example. When the buffer layer BF is provided in multiple layers, the respective layers may include the same material, or may include different materials from each other. The buffer layer BF may also be omitted according to a material of the substrate SUB and a processing condition.

An active pattern ACT is provided on the buffer layer BF. The active pattern ACT includes a semiconductor material. The active pattern ACT may include a source region, a drain region, and a channel region provided between the source region and the drain region. In an exemplary embodiment, the active pattern ACT may be a semiconductor pattern including polysilicon, amorphous silicon, an oxide semiconductor, and the like, for example. The channel region is a semiconductor pattern, in which impurities are not doped, and may be an intrinsic semiconductor. The source region and the drain region may be semiconductor patterns, in which impurities are doped. In an exemplary embodiment, n-type impurities, p-type impurities, and other metal, for example, may be used as the impurities.

A first insulating layer INS1 is provided on the active pattern ACT. The first insulating layer INS1 may be an inorganic insulating layer including an inorganic material, and may also be an organic insulating layer including an organic material. In an exemplary embodiment, an inorganic insulating material, such as a silicon nitride, a silicon oxide, and a silicon oxynitride, may be used as the inorganic material. In an exemplary embodiment, an organic insulating material, such as a polyacryl compound, a polyimide compound, a fluorinate carbon compound, such as Teflon, and a benzocyclobutene compound, may be used as the organic material.

A gate electrode GE and a capacitor lower electrode LE are provided on the first insulating layer INS1. The gate electrode GE is provided so as to overlap a region corresponding to the channel region of the active pattern ACT.

The gate electrode GE and the capacitor lower electrode LE may include metal. In an exemplary embodiment, the gate electrode GE may include at least one of the metals, such as gold (Au), silver (Ag), aluminum (Al), molybdenum (Mo), chrome (Cr), titanium (Ti), nickel (Ni), neodymium (Nd), and copper (Cu), or an alloy of the metals, for example. In an exemplary embodiment, the gate electrode GE may be provided with a single layer, but is not limited thereto, and the gate electrode GE may be provided with multiple layers, in which two or more materials among the metals and the alloys are stacked.

In an exemplary embodiment of the invention, although not illustrated, other lines including the gate lines may include the same material as those of the gate electrode GE and the capacitor lower electrode LE and provided in the same layer as those of the gate electrode GE and the capacitor lower electrode LE. Here, other lines, such as the gate lines, may be directly or indirectly connected to a part of the transistor, for example, the gate electrode GE, within each pixel PXL.

A second insulating layer INS2 is provided on the gate electrode GE and the capacitor lower electrode LE. The second insulating layer INS2 may be an inorganic insulating layer including an inorganic material. In an exemplary embodiment, polysiloxane, a silicon nitride, a silicon oxide, and a silicon oxynitride may be used as the inorganic material, for example.

A capacitor upper electrode UE is provided on the second insulating layer INS2. The capacitor upper electrode UE may include metal. In an exemplary embodiment, the capacitor upper electrode UE may include at least one of the metals, such as gold (Au), silver (Ag), aluminum (Al), molybdenum (Mo), chrome (Cr), titanium (Ti), nickel (Ni), neodymium (Nd), and copper (Cu), or an alloy of the metals, for example. In an exemplary embodiment, the capacitor upper electrode UE may be provided with a single layer, but is not limited thereto, and the capacitor upper electrode UE may be provided with multiple layers, in which two or more materials among the metals and the alloys are stacked.

The capacitor lower electrode LE and the capacitor upper electrode UE form the capacitor Cst with the second insulating layer INS2 interposed therebetween. In an exemplary embodiment of the invention, the case where the capacitor Cst includes the capacitor lower electrode LE and the capacitor upper electrode UE is disclosed, but the invention is not limited thereto, and the capacitor Cst may be implemented by various methods.

A third insulating layer INS3 is provided on the capacitor upper electrode UE. The third insulating layer INS3 may be an inorganic insulating layer including an inorganic material. In an exemplary embodiment, polysiloxane, a silicon nitride, a silicon oxide, and a silicon oxynitride may be used as the inorganic material, for example.

A source electrode SE and a drain electrode DE are provided on the third insulating layer INS3. The source electrode SE and the drain electrode DE are in contact with the source region and the drain region of the active pattern ACT, respectively, through contact holes defined in the third insulating layer INS3, the second insulating layer INS2, and the first insulating layer INS1.

The source electrode SE and the drain electrode DE may include metal. In an exemplary embodiment, the source electrode SE and the drain electrode DE may include at least one of the metals, such as gold (Au), silver (Ag), aluminum (Al), molybdenum (Mo), chrome (Cr), titanium (Ti), nickel (Ni), neodymium (Nd), and copper (Cu), or an alloy of the metals, for example. In an exemplary embodiment, the source electrode SE and the drain electrode DE may be provided with a single layer, but is not limited thereto, and the source electrode SE and the drain electrode DE may be provided with multiple layers, in which two or more materials among the metals and the alloys are stacked.

In an exemplary embodiment of the invention, although not illustrated, the data lines DL or the first power source lines may include the same material as those of the source electrode SE and the drain electrode DE and may be provided in the same layer as those of the source electrode SE and the drain electrode DE. Here, the data lines DL or the first power source lines may be directly or indirectly connected to a part of the transistor, for example, the source electrode SE and the drain electrode DE, within each pixel PXL.

A passivation layer PSV may be provided on the source electrode SE and the drain electrode DE. The passivation layer PSV may be an inorganic insulating layer including an inorganic material. In an exemplary embodiment, polysiloxane, a silicon nitride, a silicon oxide, and a silicon oxynitride may be used as the inorganic material, for example. The passivation layer PSV may be omitted according to another exemplary embodiment.

A fourth insulating layer INS4 may be provided on the passivation layer PSV. In another exemplary embodiment, when the passivation layer PSV is omitted, the fourth insulating layer INS4 may be provided on the third insulating layer INS3.

The fourth insulating layer INS4 may be an organic insulating layer including an organic material. In an exemplary embodiment, an organic insulating material, such as a polyacryl compound, a polyimide compound, a fluorinate carbon compound, such as Teflon, and a benzocyclobutene compound, may be used as the organic material, for example.

A connection pattern CNP may be provided on the fourth insulating layer INS4. The connection pattern CNP is connected to the drain electrode DE of the transistor through a contact hole passing through the fourth insulating layer INS4 and the passivation layer PSV. In an exemplary embodiment, the connection pattern CNP may include at least one of the metals, such as gold (Au), silver (Ag), aluminum (Al), molybdenum (Mo), chrome (Cr), titanium (Ti), nickel (Ni), neodymium (Nd), and copper (Cu), or an alloy of the metals, for example. In an exemplary embodiment, the connection pattern CNP may be provided with a single layer, but is not limited thereto, and the connection pattern CNP may be provided with multiple layers, in which two or more materials among the metals and the alloys are stacked.

In an exemplary embodiment of the invention, although not illustrated, other lines including a dummy power source line and the like may include the same material as that of the connection pattern CNP and provided in the same layer as that of the connection pattern CNP.

A fifth insulating layer INS5 may be provided on the connection pattern CNP. The fifth insulating layer INS5 may be an organic insulating layer including an organic material. In an exemplary embodiment, an organic insulating material, such as a polyacryl compound, a polyimide compound, a fluorinate carbon compound, such as Teflon, and a benzocyclobutene compound, may be used as the organic material.

A first electrode EL1 may be provided on the fifth insulating layer INS5. The first electrode EL1 is connected to the connection pattern CNP through a contact hole passing through the fifth insulating layer INS5, and is connected to the drain electrode DE via the connection pattern CNP through a contact hole passing through the fourth insulating layer INS4 and the passivation layer PSV to be connected to the transistor. Herein, the first electrode EL1 may be used as one of an anode and a cathode according to an exemplary embodiment.

In an exemplary embodiment of the invention, it is illustrated that the organic insulating layer including the fourth insulating layer INS4 and the fifth insulating layer INS5 are provided on the passivation layer PSV, but the organic insulating layer may be differently disposed. In an exemplary embodiment of the invention, only one organic insulating layer may be provided between the passivation layer PSV and the first electrode EL1. That is, according to an exemplary embodiment of the invention, only one organic insulating layer may be provided on the passivation layer PSV and the first electrode may be provided on the organic insulating layer. In this case, the connection pattern CNP is omitted, and the first electrode EL1 may be directly connected to the drain electrode DE through a contact hole defined in the organic insulating layer. Hereinafter, even when the organic insulating layer includes two layers including the fourth insulating layer INS4 and the fifth insulating layer INS5 in an exemplary embodiment, the exemplary embodiment includes the case where the organic insulating layer is not divided and includes one organic insulating layer, as well as the case where the organic insulating layer is divided into the fourth insulating layer INS4 and the fifth insulating layer INS5.

In an exemplary embodiment, the first electrode EL1 may include a metal layer including Ag, Mg, Al, Pt, Pd, Au, Ni, Nd, Ir, Cr, and an alloy thereof and/or indium tin oxide ("ITO"), indium zinc oxide ("IZO"), zinc oxide (ZnO), indium tin zinc oxide ("ITZO"), and the like, for example.

In an exemplary embodiment of the invention, the first electrode EL1 may include one type of metal, but is not limited thereto, and the first electrode EL1 may also include two or more types of metal, for example, an alloy of Ag and Mg, for example.

When an image is desired to be provided in a down direction of the substrate SUB, the first electrode EL1 may include a transparent conductive layer, and when an image is desired to be provided in an up direction of the substrate SUB, the first electrode EL1 may include a metal reflective layer and/or a transparent conductive layer.

A pixel defining layer PDL, which divides a pixel area so as to correspond to each pixel PXL, is provided on the substrate SUB on which the first electrode EL1 and the like is provided. The pixel defining layer PDL is an organic insulating layer including an organic material. In an exemplary embodiment, an organic insulating material, such as a polyacryl compound, a polyimide compound, a fluorinate carbon compound, such as Teflon, and a benzocyclobutene compound, may be used as the organic material.

The pixel defining layer PDL exposes an upper surface of the first electrode EL1 and protrudes from the substrate SUB along a circumference of the pixel PXL.

An organic emission layer OL may be provided in the pixel area surrounded by the pixel defining layer PDL.

The organic emission layer OL may include a low molecular or high molecular material. In an exemplary embodiment, the low molecular material may include copper phthalocyanine (CuPc), N,N'-Di(naphthalene-1-yl)-N, N'-diphenyl-benzidine ("NPB"), tris-8-hydroxyquinoline aluminum (Alq$_3$), and the like, for example. The materials may be provided by a vapor depositing method. In an exemplary embodiment, the high molecular material may include PEDOT, a poly-phenylenevinylene ("PPV") based material, and a polyfluorene based material, for example.

The organic emission layer OL may be provided with a single layer, but may be provided with multiple layers including various functional layers. When organic emission layer OL is provided with multiple layers, the organic emission layer OL may have a structure, in which a hole injection layer ("HIL"), a hole transport layer ("HTL"), an emission layer ("EML"), an electron transport layer ("ETL"), and an electron injection layer ("EIL") are stacked in a single or complex structure. In an exemplary embodiment, the organic emission layer OL may be provided by an evaporation method, a screen printing method, an inkjet printing method, a laser induced thermal imaging ("LITI") method, and the like, for example.

The organic emission layer OL is not essentially limited thereto, and may also have various structures as a matter of course. Further, at least a part of the organic emission layer OL may be unitary over the plurality of first electrodes EL1, and may also be individually provided so as to correspond to the plurality of first electrodes EL1, respectively.

A second electrode EL2 is provided on the organic emission layer OL. The second electrode EL2 may also be provided to every pixel PXL, but may be provided so as to cover most of the display area DA, and may be shared by the plurality of pixels PXL.

The second electrode EL2 may be used as one of an anode and a cathode according to an exemplary embodiment, and when the first electrode EL1 is the anode, the second electrode EL2 may be used as a cathode, and when the first electrode EL1 is the cathode, the second electrode EL2 may be used as an anode.

In an exemplary embodiment, the second electrode EL2 may include a metal layer including Ag, Mg, Al, Pt, Pd, Au, Ni, Nd, Ir, and Cr, and/or a transparent conductive layer including ITO, IZO, ZnO, ITZO, and the like, for example. In an exemplary embodiment of the invention, the second electrode EL2 may be provided with multiple layers including dual layers or more including a metal thin film, and for example, triple layers including ITO/Ag/ITO, for example.

When an image is desired to be provided in the down direction of the substrate SUB, the second electrode EL2 may include a metal reflective layer and/or a transparent conductive layer, and when an image is desired to be provided in the up direction of the substrate SUB, the second electrode EL2 may include a transparent conductive layer.

A sealing layer SL is provided on the second electrode EL2. The sealing layer SL may be provided with a single layer, but may be provided with multiple layers. In an exemplary embodiment of the invention, the sealing layer SL may include a first sealing layer SL1 to a third sealing layer SL3. The first to third sealing layers SL1 to SL3 may include an organic material and/or an inorganic material. The sealing layer SL positioned at an outermost portion may include an inorganic material.

In an exemplary embodiment of the invention, the first sealing layer SL1 may include an inorganic material, the second sealing layer SL2 include an organic material or an inorganic material, and the third sealing layer SL3 may include an inorganic material. In the case of the inorganic material, moisture or oxygen less permeates than the organic material, but elasticity or flexibility is low, so that the inorganic material is vulnerable to a crack. The first sealing layer SL1 and the third sealing layer SL3 may include an inorganic material and the second sealing layer SL2 may include an organic material, thereby preventing a crack from being spread. In an exemplary embodiment, when the second sealing layer SL2 includes an organic material, the second sealing layer SL2 may be completely covered by the third sealing layer SL3 so that an end portion of the second sealing layer SL2 is not exposed to the outside.

In an exemplary embodiment of the invention, an organic insulating material, such as a polyacryl compound, a polyimide compound, a fluorinate carbon compound, such as Teflon, and a benzocyclobutene compound may be used as the organic material. In an exemplary embodiment, polysiloxane, a silicon nitride, a silicon oxide, and a silicon oxynitride may be used as the inorganic material. In an exemplary embodiment, when the second sealing layer SL2 includes an inorganic material, instead of an organic material, various silicon-based insulating materials, for example, hexamethyldisiloxane ("HMDSO"), octamethylcyclotetrasiloxane ("OMCTSO"), tetramethyldisiloxane ("TMDSO"), and tetraethyleorthosilicate ("TEOS"), may be used. In an exemplary embodiment of the invention, the organic emission layer OL forming the light emitting device may be easily damaged by moisture or oxygen from the outside. The sealing layer SL protects the organic emission layer OL by covering the organic emission layer OL. The sealing layer SL may cover the display area DA, and may be extended to an external side of the display area DA.

However, the insulating layers including an organic material are advantageous in the exemplary embodiment of flexibility and elasticity, but moisture or oxygen easily permeates compared to the insulating layer including an inorganic material. In an exemplary embodiment of the invention, in order to prevent moisture or oxygen from permeating through the insulating layers including an organic material, end portions of the insulating layers including an organic material may be covered by the insulating layers including an inorganic material so as not to be exposed to the outside. In an exemplary embodiment, the fourth insulating layer INS4, the fifth insulating layer INS5, and/or the pixel defining layer PDL including the organic material are extended only to a part of the non-display area NDA, and do not entirely cover the non-display area NDA. Particularly, a first opening OPN1, in which parts of the fourth insulating layer INS4, the fifth insulating layer INS5, and/or the pixel defining layer PDL are removed along the circumference of the display area DA, is defined in the fourth insulating layer INS4, the fifth insulating layer INS5, and/or the pixel defining layer PDL including the organic material.

In an exemplary embodiment of the invention, an upper surface of the pixel defining layer PDL, and the lateral surfaces of the fourth insulating layer INS4, the fifth insulating layer INS5, and/or the pixel defining layer PDL exposed by the portion, in which the first opening OPN1 is provided, are sealed by the insulating layer, for example, the sealing layer SL, including the inorganic material, so that the fourth insulating layer INS4, the fifth insulating layer INS5, and/or the pixel defining layer PDL are prevented from being exposed to the outside. Whether the sealing layer SL is provided with multiple layers and a material of the sealing layer SL are not limited thereto, and may be variously changed. In an exemplary embodiment, the sealing layer SL may include a plurality of organic material layers and a plurality of inorganic material layers which are alternately stacked, for example.

Next, the non-display area NDA will be described. Hereinafter, in describing the non-display area NDA, in order to avoid the overlapping of the description, the description of the previously described matters may be omitted or will be briefly given.

In an exemplary embodiment of the invention, the line part LP is provided in the non-display area NDA, and has the bent area BA in which the substrate SUB is folded.

The line part LP includes the data lines DL, and connects the driver and the pixels PXL.

The data lines DL according to an exemplary embodiment of the invention may connect the pixels PXL and the driver, and to this end, the data lines DL may be approximately extended from the pixels PXL in the second direction DR2. The data lines DL may be extended to the pad area PA that is the end portion of the additional area ADA in the second direction DR2, and contact electrodes CTE may be provided to the end portion. In an exemplary embodiment, the pixels PXL may be connected to the driver, which is implemented of a COF, for example, through the contact electrodes CTE connected to the lines.

The data lines DL include first data lines DL1 and second data lines DL2.

The first data lines DL1 may include a plurality of connected sub lines.

The second data lines DL2 may also include a plurality of connected sub lines. FIG. 6 illustrates only a second fan-out line DL2$b$, a second link line DL2$c$, and a second connection line DL2$d$ among the data lines DL for convenience of the description, but the invention is not limited thereto. The data lines DL will be described below.

The buffer layer BF is provided on the non-display area NDA of the substrate SUB.

The first insulating layer INS1 to the fourth insulating layer INS4 are sequentially provided on the buffer layer BF.

Herein, a second opening OPN2 is provided in the insulating layers provided in the bent area BA. The bent area BA is an area, in which the substrate SUB is bent. That is, the portions of the buffer layer BF, the first insulating layer INS1, the second insulating layer INS2, and the third insulating layer INS3 corresponding to the bent area BA are removed, so that the second opening OPN2 is defined in the buffer layer BF, the first insulating layer INS1, the second insulating layer INS2, and the third insulating layer INS3. According to another exemplary embodiment, the parts of the buffer layer BF, the first insulating layer INS1, the second insulating layer INS2, and the third insulating layer INS3 corresponding to the bent area BA may not be removed. In an exemplary embodiment, the portion of the buffer layer BF corresponding to the bent area BA may not be removed, the portions of the remaining insulating layers, that is, the first insulating layer INS1, the second insulating layer INS2, and the third insulating layer INS3, may be removed to define the second opening OPN2, for example.

The feature that the second opening OPN2 corresponds to the bent area BA may be understood that the second opening OPN2 overlaps the bent area BA. An area of the opening OPN may be larger than an area of the bent area BA. In the illustrated exemplary embodiment of the invention, it is illustrated that a width of the second opening OPN2 is larger than a width of the bent area BA, but this is for convenience of the description, and a width of the second opening OPN1 may be equal to or different from a width of the bent area BA.

For reference, FIG. 6 illustrates that all of the internal surfaces of the buffer layer BF, the first insulating layer INS1, the second insulating layer INS2, and the third insulating layer INS3 correspond to one another, so that the buffer layer BF, the first insulating layer INS1, the second insulating layer INS2, and the third insulating layer INS3 define a straight internal surface, but the invention is not limited thereto. In an exemplary embodiment, the second opening OPN2 of the third insulating layer INS3 may be provided with a larger area than that of the second opening OPN2 of the buffer layer BF. In the exemplary embodiment of the invention, the second opening OPN2 of the buffer layer BF may be defined with the smallest area among the second opening OPN2 of the first insulating layer INS1, the second opening OPN2 of the second insulating layer INS2, and the second opening OPN2 of the third insulating layer INS3.

A bent portion insulating layer INS_B is provided in the second opening OPN2. The bent portion insulating layer INS_B is filled in at least a part of the second opening OPN2, and FIG. 6 of the invention illustrates that the second opening OPN2 is completely filled. In the exemplary embodiment of the invention, the bent portion insulating layer INS_B may be filled in the second opening OPN2, and simultaneously cover a region adjacent to the second opening OPN2, for example, a part of an upper portion of the third insulating layer INS3 corresponding to the first and/or second flat areas FA1 and FA2.

The bent portion insulating layer INS_B may be an organic insulating layer including an organic material. In an exemplary embodiment, an organic insulating material, such as a polyacryl compound, a polyimide compound, a fluorinate carbon compound, such as Teflon, and a benzocyclobutene compound, may be used as the organic material.

As described above, FIG. 6 illustrates the state where the display device is not bent, but the display device according to an exemplary embodiment of the invention may be bent in the bent area BA. The display device according to the exemplary embodiment of the invention is manufactured in a flat state, and then is bendable thereafter.

In the exemplary embodiment of the invention, it is illustrated that the bent area BA is within a portion, in which the inorganic insulating layer is removed, but this is for convenience of the description, and the bent area BA may also correspond to the portion, in which the inorganic insulating layer is removed. In an exemplary embodiment, the bent area BA generally corresponds to the portion, in which the inorganic insulating layer is removed, but the bent area BA may be equal to, or wider or narrower than the portion, in which the inorganic insulating layer is removed, for example. Further, in the exemplary embodiment of the invention, it is illustrated that the bent area BA is positioned only in the non-display area NDA, but the invention is not limited thereto. In an exemplary embodiment, the bent area BA may also be provided over the non-display area NDA and the display area DA, and may also be provided within the display area DA, for example.

The passivation layer PSV may be provided on the substrate SUB. The passivation layer PSV may be an inorganic insulating layer, and in this case, the passivation layer PSV is not provided in a region corresponding to the bent area BA, like the inorganic insulating layers (the buffer layer BF, the first insulating layer INS1, the second insulating layer INS2, and/or the third insulating layer INS3). Further, the passivation layer PSV exposes a part of an upper surface of a lower contact electrode CTEa.

The fourth insulating layer INS4 may be provided on the passivation layer PSV. The fifth insulating layer INS5 may be provided on the fourth insulating layer INS4. Parts of the fourth insulating layer INS4 and the fifth insulating layer INS5 are removed along the circumference of the display area DA, so that the first opening OPN1 is defined in the fourth insulating layer INS4 and the fifth insulating layer INS5. Accordingly, the fourth insulating layer INS4 and the fifth insulating layer INS5 are not continuously extended from the display area DA to the non-display area NDA.

As described above, the lateral surfaces of the fourth insulating layer INS4 and the fifth insulating layer INS5 provided at the display area DA side are covered by the sealing layer SL. However, an upper surface of the fifth insulating layer INS5 provided at the non-display area NDA side, and the lateral surfaces of the fourth insulating layer INS4 and the fifth insulating layer INS5 do not need to be completely covered by the sealing layer SL, and may be at least partially exposed to the outside.

The lower contact electrode CTEa may be provided on the third insulating layer INS3, and an upper contact electrode CTEb may be provided on the lower contact electrode CTEa. The upper contact electrode CTEb may include the same material in the same process as that of the connection pattern CNP of the display area DA. The lower contact electrode CTEa and the upper contact electrode CTEb form the contact electrode CTE, and the lines may be connected to the driver implemented of a COF, a flexible PCB ("FPCB"), or the like through the contact electrode CTE.

Next, the contact structures of the data lines will be described in detail with reference to the drawings. In the drawings below, some elements are omitted for convenience of the description, and contents of the omitted elements follow the contents of the aforementioned exemplary embodiment.

Figure 8A:
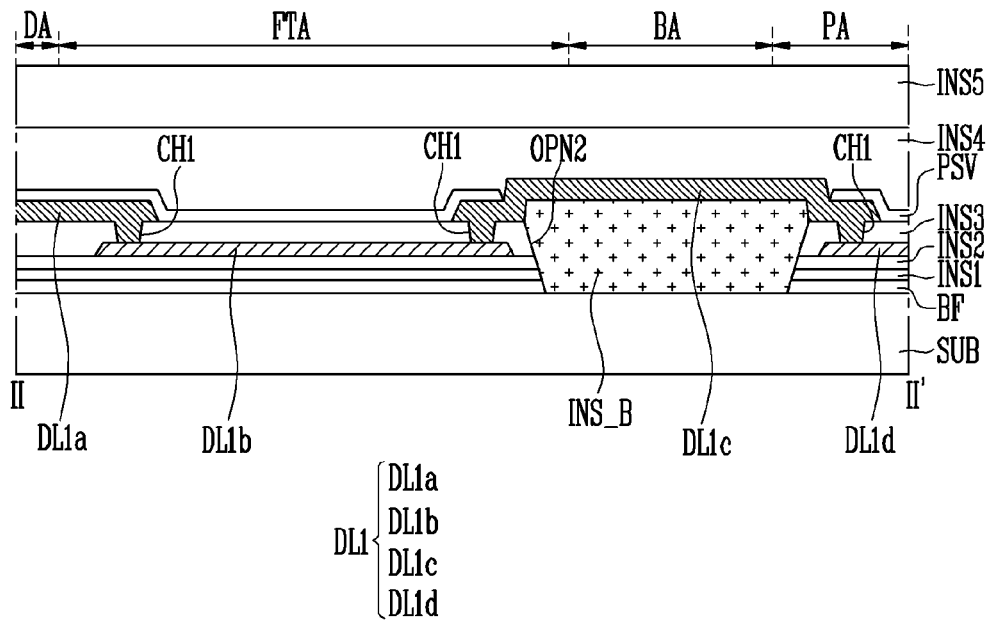
FIG. 8A is a cross-sectional view taken along line II-II' of FIG. 7.
Figure 8B:
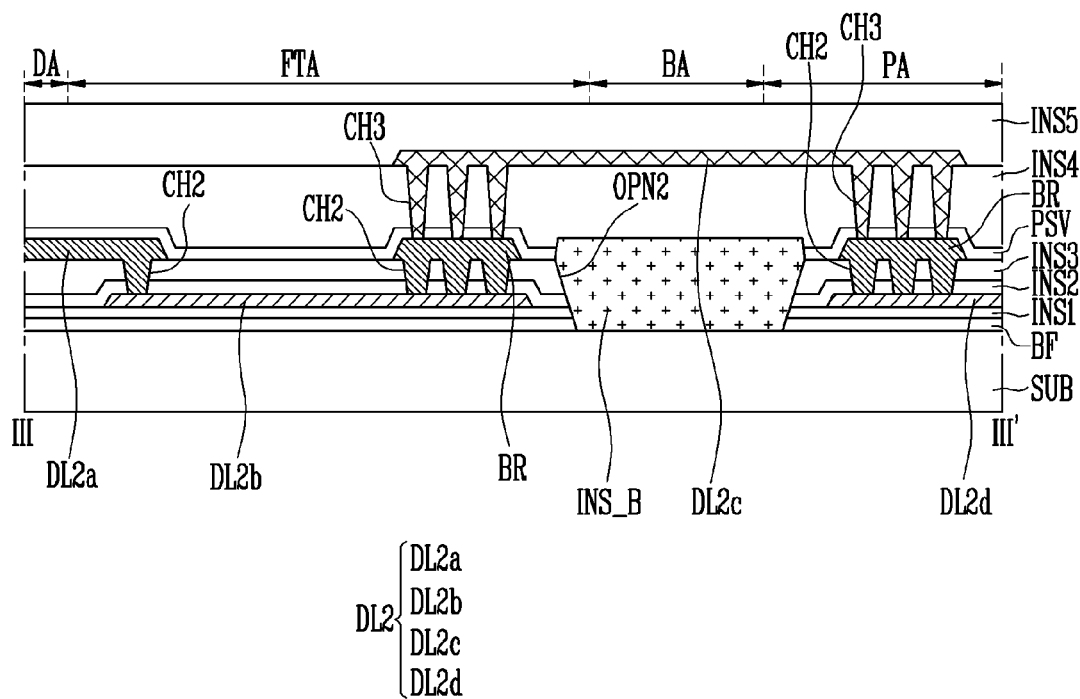
FIG. 8B is a cross-sectional view taken along line III-III' of FIG. 7.
Figure 8C:
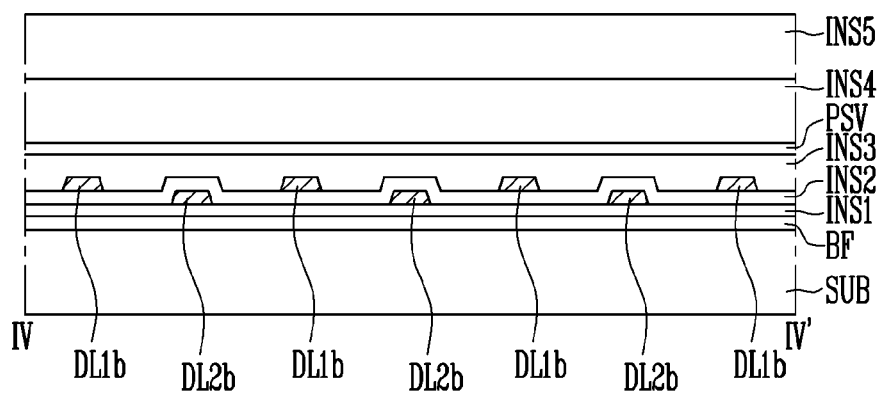
FIG. 8C is a cross-sectional view taken along line IV-IV' of FIG. 7.
Figure 8D:
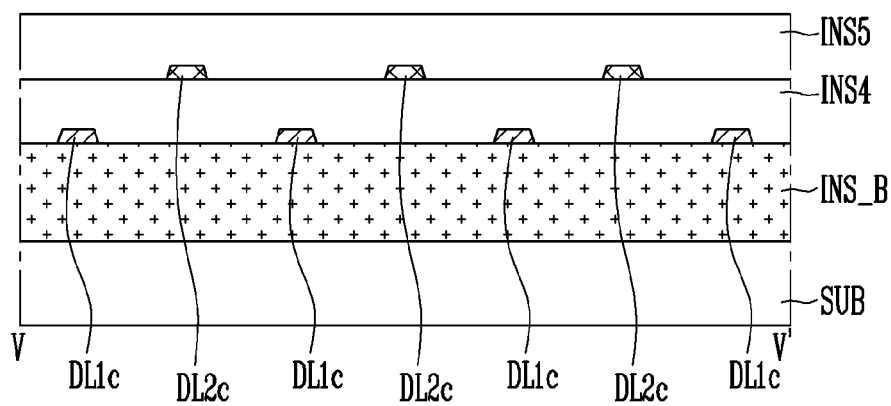
FIG. 8D is a cross-sectional view taken along line V-V' of FIG. 7.

FIG. 7 is a plan view conceptually illustrating a portion corresponding to A1 of FIG. 2. FIG. 8A is a cross-sectional view taken along line II-II' of FIG. 7, FIG. 8B is a cross-sectional view taken along line III-III' of FIG. 7, FIG. 8C is a cross-sectional view taken along line IV-IV' of FIG. 7, and FIG. 8D is a cross-sectional view taken along line V-V' of FIG. 7.

Referring to FIGS. 7, and 8A to 8D, the data lines DL include the first data lines DL1 connected to the first pixel column C1 (refer to FIGS. 3A and 3B) and the second data lines DL2 connected to the second pixel column C2 (refer to FIGS. 3A and 3B).

The first pixels of the first color are connected to the first pixel column. The second pixels of the second color and the third pixels of the third color are connected to the second pixel column. In the exemplary embodiment of the invention, the first color may be a green color, and thus, the first data lines DL1 may be connected to the green pixels. In the illustrated exemplary embodiment of the invention, the second color may be a red color and the third color may be a blue color, and thus, the second data lines DL2 may be connected to the red pixels and the green pixels, for example.

Hereinafter, the first data lines DL1 and the second data lines DL2 on the plane will be described with reference to FIG. 7, and the first data lines DL1 and the second data lines DL2 on the cross-section will be described with reference to FIGS. 8A to 8D.

Referring to FIG. 7, the first data lines DL1 and the second data lines DL2 are provided in plural, and are alternately disposed in the first direction DR1.

The first data lines DL1 and the second data lines DL2 are extended in the display area DA in the second direction DR2. The first data lines DL1 and the second data lines DL2 are approximately extended in the fan-out area FTA in the second direction DR2 and an interval between the adjacent data lines DL is decreased in the second direction DR2. The first data lines DL1 and the second data lines DL2 are extended in the bent area BA and the pad area PA in the second direction DR2. Accordingly, the interval between the adjacent data lines DL is decreased in the second direction DR2 is provided to be smaller in the bent area BA and the pad area PA than that in the display area DA.

Each of the first data lines DL1 includes the plurality of connected sub lines. The sub lines may include first pixel unit data lines DL1a provided in the display area DA, first fan-out lines DL1b provided in the fan-out area FTA, first link lines DL1c provided in the bent area BA, and first connection lines DL1d provided in the pad area PA. The first pixel unit data line DL1a is connected to the first fan-out line DL1b, the first fan-out line DL1b is connected to the first link line DL1c, and the first link line DL1c is connected to the first connection line DL1d. Although not illustrated, the first connection line DL1d may be connected to the driver through the contact electrode and the like.

An end portion of the first pixel unit data line DL1a and an end portion of the first fan-out line DL1b overlap, and are connected to each other through a first contact hole CH1. In the illustrated exemplary embodiment, the overlapping portion of the first pixel unit data line DL1a and the first fan-out line DL1b may be disposed in the fan-out area FTA. However, the overlapping portion of the first pixel unit data line DL1a and the first fan-out line DL1b is not limited thereto, and at least a part of the overlapping portion of the first pixel unit data line DL1a and the first fan-out line DL1b may also be provided within the display area DA, for example.

The end portion of the first fan-out line DL1b and an end portion of the first link line DL1c overlap, and are connected to each other through the first contact hole CH1. In the illustrated exemplary embodiment, an overlapping portion of the first fan-out line DL1b and the first link line DL1c may be provided in the fan-out area FTA. However, the overlapping portion of the first fan-out line DL1b and the first link line DL1c is not limited thereto, and at least a part of the overlapping portion of the first fan-out line DL1b and the first link line DL1c may also be provided within the bent area BA, for example.

The end portion of the first link line DL1c and an end portion of the first connection line DL1d are connected to each other through the first contact hole CH1. In the illustrated exemplary embodiment, an overlapping portion of the first link line DL1c and the first connection line DL1d may be provided in the pad area PA, for example. However, the overlapping portion of the first link line DL1c and the first connection line DL1d is not limited thereto, and at least a part of the overlapping portion of the first link line DL1c and the first connection line DL1d may also be provided within the bent area BA, for example.

Each of the second data lines DL2 includes the plurality of connected sub lines. The sub lines may include second pixel unit data lines DL2a provided in the display area DA, second fan-out lines DL2b provided in the fan-out area FTA, second link lines DL2c provided in the bent area BA, second connection lines DL2d provided in the pad area PA, and a bridge BR provided in the fan-out area FTA and the pad area PA. The second pixel unit data line DL2a is connected to the second fan-out line DL2b, the second fan-out line DL2b is connected to the second link line DL2c, and the second link line DL2c is connected to the second connection line DL2d. Although not illustrated, the second connection line DL2d is connected to the driver through the contact electrode and the like.

An end portion of the second pixel unit data line DL2a and an end portion of the second fan-out line DL2b overlap, and are connected to each other through a second contact hole CH2. In the illustrated exemplary embodiment, the overlapping portion of the second pixel unit data line DL2a and the second fan-out line DL2b may be disposed in the fan-out area FTA, for example. However, the overlapping portion of the second pixel unit data line DL2a and the second fan-out line DL2b is not limited thereto, and at least a part of the overlapping portion of the second pixel unit data line DL2a and the second fan-out line DL2b may also be provided within the display area DA, for example.

The end portion of the second fan-out line DL2b, the bridge BR, and an end portion of the link line DL2c are connected with one another through the second contact hole CH2 and a third contact hole CH3. The second contact hole CH2 and the third contact hole CH3 may overlap in a plan view. In the illustrated exemplary embodiment, an overlapping portion of the second fan-out line DL2b, the bridge BR, and the second link line DL2c may be provided in the fan-out area FTA. However, the overlapping portion of the second fan-out line DL2b, the bridge BR, and the second link line DL2c is not limited thereto, and at least a part of the overlapping portion of the second fan-out line DL2b, the bridge BR, and the second link line DL2c may also be provided within the bent area BA, for example.

The end portion of the second link line DL2bc, the bridge BR, and the end portion of the second connection line DL2d are connected with one another through the second contact hole CH2 and the third contact hole CH3. The second contact hole CH2 and the third contact hole CH3 may overlap in a plan view. In an exemplary embodiment, an overlapping portion of the second link line DL2c, the bridge BR, and the second connection line DL2d may be provided in the pad area PA. However, the overlapping portion of the second link line DL2c, the bridge BR, and the second connection line DL2d is not limited thereto, and at least a part of the overlapping portion of the second link line DL2c, the bridge BR, and the second connection line DL2d may also be provided within the bent area BA, for example.

Referring to FIG. 8A, the buffer layer BF, the first insulating layer INS1 to the third insulating layer INS3, the passivation layer PSV, the fourth insulating layer INS4, and the fifth insulating layer INS5 are stacked in the display area DA and a part of the non-display area NDA. The bent portion insulating layer INS_B, the fourth insulating layer INS4, and the fifth insulating layer INS5 are stacked on the substrate SUB of the bent area BA in the non-display area NDA (refer to FIG. 1).

The first data line DL1 is provided on the third insulating layer INS3 in the display area DA, is provided on the second insulating layer INS2 in the fan-out area FTA, is provided on the bent portion insulating layer INS_B in the bent area BA, and is provided on the second insulating layer INS2 in the pad area PA. Particularly, the first pixel unit data line DL1a is provided on the third insulating layer INS3 in the display area DA, the first fan-out line DL1b is provided on the second insulating layer INS2 in the fan-out area FTA, the first link line DL1c is provided on the bent portion insulating layer INS_B in the bent area BA, and the first connection line DL1*d* is provided on the second insulating layer INS2 in the pad area PA.

The third insulating layer INS3 is provided with the first contact hole CH1 which exposes a part of an upper surface of the first fan-out line DL1*b* and a part of the first connection line DL1*d*. The first pixel unit data line DL1*a* and the first link line DL1*c* are respectively connected to the first fan-out line DL1*b* and the first connection line DL1*d* through the first contact holes CH1.

Referring to FIG. 8B, the buffer layer BF, the first insulating layer INS1 to the third insulating layer INS3, the passivation layer PSV, the fourth insulating layer INS4, and the fifth insulating layer INS5 are stacked in the display area DA and a part of the non-display area NDA. The bent portion insulating layer INS_B, the fourth insulating layer INS4, and the fifth insulating layer INS5 are stacked on bent area BA in the non-display area NDA.

The second data line DL2 is provided on the third insulating layer INS3 in the display area DA, is provided on the first insulating layer INS1 in the fan-out area FTA, is provided on the fourth insulating layer INS4 in the bent area BA, and is provided on the first insulating layer INS1 in the pad area PA. Particularly, the second pixel unit data line DL2*a* is provided on the third insulating layer INS3 in the display area DA, the second fan-out line DL2*b* is provided on the first insulating layer INS1 in the fan-out area FTA, the second link line DL2*c* is provided on the fourth insulating layer INS4 in the bent area BA, the second connection line DL2*d* is provided on the first insulating layer INS1 in the pad area PA, and the bridges BR are provided on the third insulating layer INS3.

The second insulating layer INS2 and the third insulating layer INS3 are provided with the second contact holes CH2, which partially exposes an upper surface of the second fan-out line DL2*b* and an upper surface of the second connection line DL2*d*. The passivation layer PSV and the fourth insulating layer INS4 are provided with the third contact holes CH3, which partially exposes the upper surfaces of the bridges BR. The second pixel unit data line DL2*a* and the second fan-out line DL2*b* are connected to each other through the second contact hole CH2. The second fan-out line DL2*b* and the second link line DL2*c* are connected to each other through the bridge BR, so that the second fan-out line DL2*b* and the bridge BR are connected through the second contact hole CH2, and the bridge BR and the second link line DL2*c* are connected to each other through the third contact hole CH3. The second link line DL2*c* and the second connection line DL2*d* are connected to each other through the bridge BR, so that the second link line DL2*c* and the bridge BR are connected to each other through the third contact hole CH3, and the bridge BR and the second connection line DL2*d* are connected to each other through the second contact hole CH2.

In the illustrated exemplary embodiment, the number of contact holes CH2 provided in the second data line DL2 in the non-display area NDA is larger than the number of contact holes CH1 provided in the first data line DL1. In an exemplary embodiment, in the first data line DL1, one contact hole CH1 is provided in the contact structure of the first fan-out line DL1*b* and the first link line DL1*c*, for example. However, in the second data line DL2, three contact holes CH2 are provided in each of the contact structures of the second fan-out line DL2*b* and the bridge BR, and the bridge BR and the second link line DL2*c*. Accordingly, contact resistance in the second data line DL2 may be decreased to be lower than that of the first data line DL1. Particularly, the fourth insulating layer INS4 is the organic layer, so that the contact resistance of the fourth insulating layer INS4 may be increased compared to the fourth insulating layer INS4 is provided with an inorganic layer, but the plurality of contact holes is provided, so that a contact area between the lower line and the upper line is increased, and thus the contact resistance is decreased. Accordingly, the resistance of the second data line DL2 is decreased, so that it is possible to compensate for a signal delay in the data lines DL2.

Referring to FIG. 8C, the first fan-out lines DL1*b* of the first data lines DL1 and the second fan-out lines DL2*b* of the second data lines DL2 are provided on different layers, and are alternately disposed on the plane. The first fan-out lines DL1*b* are disposed on the second insulating layer INS2, and the second fan-out lines DL2*b* are disposed on the first insulating layer INS1.

The first fan-out lines DL1*b* and the second fan-out lines DL2*b* have the different structures, so that it is possible to secure a large interval between the adjacent data lines DL. When the data lines DL are disposed on one layer, the interval between the adjacent data lines DL is small, but when the data lines DL are alternately disposed on two different layers, the interval between the adjacent data lines DL within one layer is increased. Accordingly, the degree of freedom in the design of the data lines DL is increased.

Referring to FIG. 8D, the first link lines DL1*c* of the first data lines DL1 and the second link lines DL2*c* of the second data lines DL2 are provided on different layers. The first link lines DL1*c* are disposed on the bent portion insulating layer INS_B, and the second link lines DL2*c* are disposed on the fourth insulating layer INS4. The first link lines DL1*c* of the first data lines DL1 and the second link lines DL2*c* of the second data lines DL2 are alternately disposed on the plane.

The first link lines DL1*c* and the second link lines DL2*c* have the different structures, so that it is possible to secure a wide interval between the adjacent data lines DL. When the data lines DL are disposed on one layer, the interval between the adjacent data lines DL is small, but when the data lines DL are alternately disposed on two different layers, the interval between the adjacent data lines DL within one layer is increased. Accordingly, the degree of freedom in the design of the data lines DL is increased.

The display device having the aforementioned structure decreases a deviation of a delay of a data signal between the first data line DL1 and the second data line DL2, thereby decreasing a defect generable due to the deviation of the delay of the data signal. That is, in the exemplary embodiment of the invention, the resistance of the first data line DL1 connected to the green pixel is provided to be relatively larger than the resistance of the second data lines DL2 connected to the red pixel and the blue pixel, and the degrees of delay of the data signals applied to the first data line and the second data line are matched, thereby preventing a vertical line defect or a greenish defect. In the exemplary embodiment, in the contact structure of the second data line DL2, the larger number of contact holes is defined than that of the contact structure of the first data line DL1, so that it is possible to decrease resistance between the connected lines, thereby more easily solving the deviation of the resistance.

The display device having the aforementioned structure decreases a deviation of a delay of a data signal between the first data line DL1 and the second data line DL2, thereby decreasing a defect generable due to the deviation of the delay of the data signal, for example, the vertical line defect or a greenish defect of an image. That is, the data line DL connected to the pixel column of the color giving large influence on resistance between the first pixel column C1 (refer to FIGS. 3A and 3B) and the second pixel column C2 (refer to FIGS. 3A and 3B) respectively connected to the first data line DL1 and the second data line DL2 has the line or the contact structure having lower resistance than that of the data line DL connected to the remaining pixel column, thereby decreasing the deviation of the delay of the data signal.

In the exemplary embodiment of the invention, the resistance of the first data line DL1 connected to the green pixel is provided to be relatively larger than the resistance of the second data lines DL2 connected to the red pixel and the blue pixel, and the degrees of delay of the data signals applied to the first data line DL1 and the second data lines DL2 are matched, thereby preventing a vertical line defect or a greenish defect.

Figure 9B:
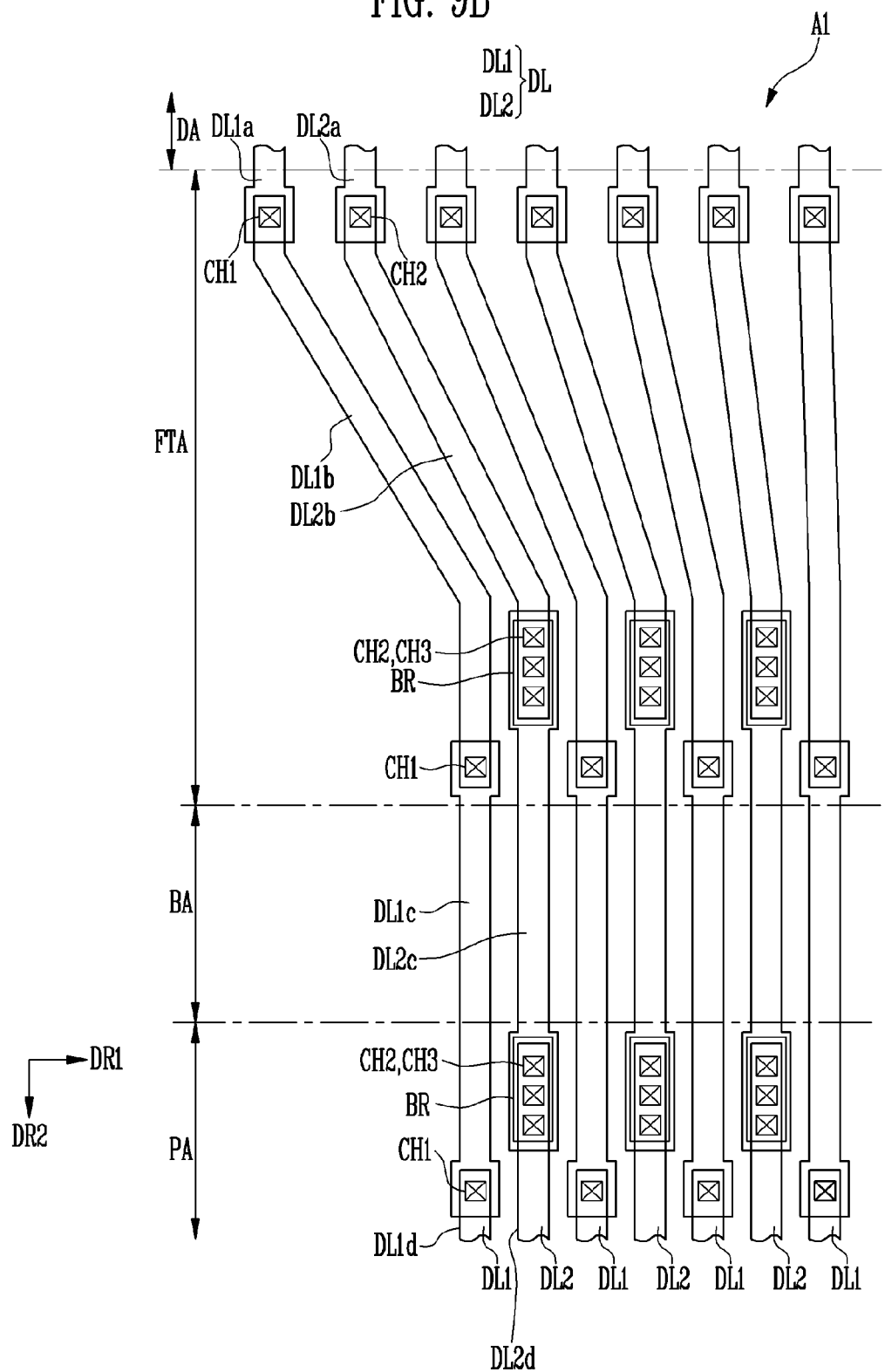

According to the exemplary embodiment of the invention, the contact structure of the data lines DL may be provided in a different form from that of the aforementioned exemplary embodiment. FIGS. 9A to 9C are plan views illustrating the data lines DL in a portion corresponding to A1 of FIG. 2 in the display device according to the exemplary embodiment of the invention.

First, referring to FIG. 9A, the contact holes in the first data lines DL1 and the second data lines DL2 may be provided at different positions in the second direction DR2. In the first and second data lines DL1 and DL2, a portion, in which the contact hole is defined, is provided with a larger width than those of other portions in order to increase a contact area. When the adjacent first and second data lines DL1 and DL2 are arranged in the first direction DR1, a distance between the adjacent first and second data lines DL1 and DL2 in the portion, in which the contact hole is defined, is decreased compared to other portions, and in this respect, a short possibility may be increased.

In order to prevent the short between the adjacent first and second data lines DL1 and DL2, the portions, in which the contact holes are defined, between the adjacent first and second data lines DL1 and DL2 may be disposed at different positions. As illustrated, the portion, in which the contact hole is defined, between the first fan-out line DL1$b$ and the first link line DL1$c$ is positioned at a position closer to the display area DA in the second direction DR2, and the portion, in which the contact hole is defined, between the second fan-out line DL2$b$ and the second link line DL2$c$ is positioned at a position farther from the display area DA in the second direction DR2. That is, the portion, in which the contact hole is defined, between the first fan-out line DL1$b$ and the first link line DL1$c$ is positioned at a position farther from the bent area BA in the second direction DR2, and the portion, in which the contact hole is defined, between the second fan-out line DL2$b$ and the second link line DL2$c$ is positioned at a position closer to the bent area BA in the second direction DR2.

As a similar form, the portion, in which the contact hole is defined, between the first link line DL1$c$ and the first connection line DL1$d$ is positioned at a position farther from the display area DA in the second direction DR2, and the portion, in which the contact hole is defined, between the second link line DL2$c$ and the second connection line DL2$d$ is positioned at a position closer to the display area DA in the second direction DR2.

Accordingly, it is possible to further decrease the interval between the adjacent first and second data lines DL1 and DL2, and more data lines may be efficiently provided in the small area.

In an exemplary embodiment of the invention, the portions, in which the contact holes are defined, between the adjacent first and second data lines DL1 and DL2 may be disposed at different positions from those of the exemplary embodiment. Through this, it is possible to additionally control resistance between the lines by adjusting the lengths of the respective sub lines of the first and second data lines and the positions of the contact holes.

Referring to FIG. 9B, the portion, in which the contact hole is defined, between the first fan-out line DL1$b$ and the first link line DL1$c$ is positioned at a position closer to the bent area BA in the second direction DR2, and the portion, in which the contact hole is defined, between the second fan-out line DL2$b$ and the second link line DL2$c$ is positioned at a position farther from the bent area BA in the second direction DR2. In contrast to this, the portion, in which the contact hole is defined, between the first link line DL1$c$ and the first connection line DL1$d$ is positioned at a position farther from the bent area BA, and the portion, in which the contact hole is defined, between the second link line DL2$c$ and the second connection line DL2$d$ is positioned at a position closer to the bent area BA.

Referring to FIG. 9C, the portion, in which the contact hole is defined, between the first fan-out line DL1$b$ and the first link line DL1$c$ is positioned at a position closer to the bent area BA in the second direction DR2, and the portion, in which the contact hole is defined, between the second fan-out line DL2$b$ and the second link line DL2$c$ is positioned at a position farther from the bent area BA in the second direction DR2. In addition, the portion, in which the contact hole is defined, between the first link line DL1$c$ and the first connection line DL1$d$ is positioned at a position closer to the bent area BA, and the portion, in which the contact hole is defined, between the second link line DL2$c$ and the second connection line DL2$d$ is positioned at a position farther from the bent area BA.

In the exemplary embodiment of the invention, the contact structures of the first and second data lines DL1 and DL2 may be variously changed within the limit, in which the resistance is matched so as to compensate for the delay of the signal between the first and second data lines DL1 and DL2. In the exemplary embodiment below, in order to avoid the overlapping of the description, different matters from those of the aforementioned exemplary embodiment will be mainly described.

FIGS. 10A to 10G are plan views illustrating some of the data lines in a portion corresponding to A2 of FIG. 9A in the display device according to an exemplary embodiment of the invention.

Figure 10A:
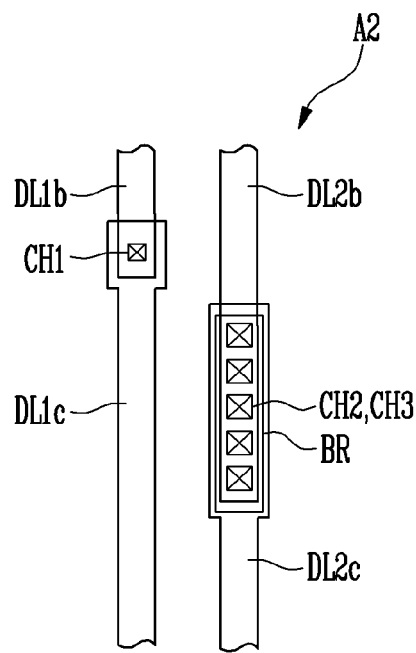
FIGS. 10A to 10G are plan views illustrating the exemplary embodiment of some of the data lines in a portion corresponding to A2 of FIG. 9A in the display device according to the invention.

Referring to FIG. 10A, in addition to the feature that the number of contact holes provided in the second data line DL2 in the non-display area NDA is larger than the number of contact holes provided in the first data line DL1, an area of the contact hole provided in the second data line DL2 may be larger than an area of the contact hole provided in the first data line DL1. The area of the contact hole provided in the second data line DL2 is increased, so that resistance of the second data line DL2 may be decreased.

In an exemplary embodiment, in the first data line DL1, the first contact hole CH1 is provided with a relatively small area in the contact structure of the first fan-out line DL1$b$ and the first link line DL1$c$, for example. However, in the second data line DL2, the five second contact holes CH2 and the five third contact holes CH3 are provided and each of the second and third contact holes CH2 and CH3 is provided with a relatively large area in the contact structures of the second fan-out line DL2$b$ and the bridge BR, and the bridge BR and the second link line DL2c. Here, the second contact hole CH2 between the second fan-out line DL2b and the bridge BR and the third contact hole CH3 between the bridge BR and the second link line DL2c may be provided with the same size at the same position in a plan view.

Accordingly, contact resistance in the second data line DL2 may be decreased to be lower than that of the first data line DL1.

Figure 10B:
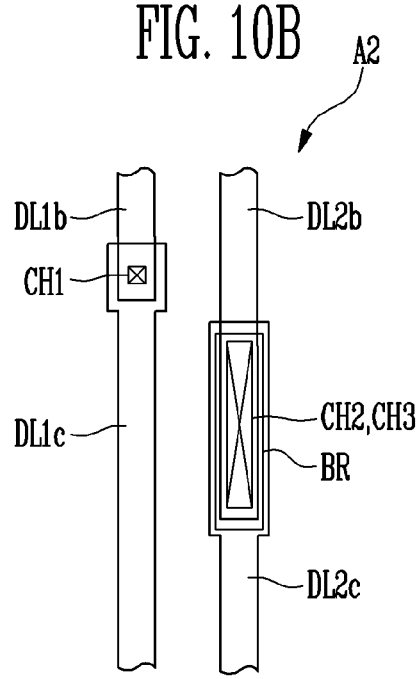

Referring to FIG. 10B, the number of contact holes provided in the second data line DL2 in the non-display area NDA is equal to the number of contact holes provided in the first data line DL1, and an area of the contact hole provided in the second data line DL2 may be larger than an area of the contact hole provided in the first data line DL1. That is, the area of the contact hole provided in the second data line DL2 is increased, so that resistance of the second data line DL2 may be decreased.

In an exemplary embodiment, in the first data line DL1, the first contact hole CH1 is provided with a relatively small area in the contact structure of the first fan-out line DL1b and the first link line DL1c, for example. However, in the second data line DL2, one second contact hole CH2 and one third contact hole CH3 are provided at the same position, and the second and third contact holes CH2 and CH3 are elongated in the second direction DR2 to be provided with a relatively large area in the contact structures of the second fan-out line DL2b and the bridge BR, and the bridge BR and the second link line DL2c.

Figure 10C:
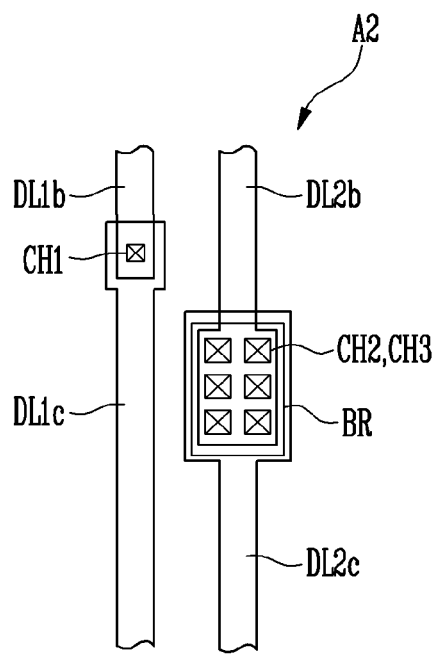

Referring to FIG. 10C, the contact holes provided in the first and second data lines DL1 and DL2 in the non-display area NDA may be disposed in various forms.

In an exemplary embodiment, in the first data line DL1, the first contact hole CH1 is provided with a relatively small area in the contact structure of the first fan-out line DL1b and the first link line DL1c, for example. However, in the second data line DL2, the six second contact holes CH2 and the six third contact holes CH3 are provided and are disposed in a 3×2 matrix form in the contact structures of the second fan-out line DL2b and the bridge BR, and the bridge BR and the second link line DL2c, for example. In the structure, the disposition of the contact holes may be variously changed into various forms in consideration of the interval between the adjacent data lines.

Figure 10D:
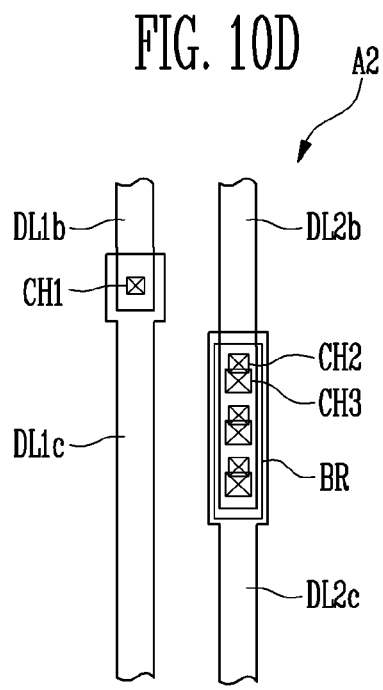

Referring to FIG. 10D, in the second data line DL2, the number of second contact holes CH2 between the second fan-out line DL2b and the bridge BR, and the number of third contact holes CH3 between the bridge BR and the second link line DL2c are the same as each other in the plan view, and the second contact holes CH2 between the second fan-out line DL2b and the bridge BR and the third contact holes CH3 between the bridge BR and the second link line DL2c may be provided with different sizes at different positions. In this case, the second contact holes CH2 and the third contact holes CH3 may also partially overlap in the plan view. In an exemplary embodiment of the invention, the third contact hole CH3 may have a larger area than that of the second contact hole CH2. When the third insulating layer INS3 includes an inorganic material, and the fourth insulating layer INS4 includes an organic material, resistance in the contact structure passing through the fourth insulating layer INS4 may be larger, and in order to efficiently decrease resistance, the contact hole in the fourth insulating layer INS4 may be provided to have a larger area.

Figure 10E:
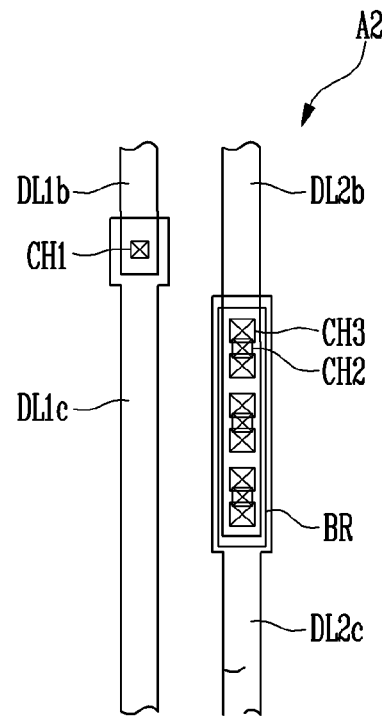

Referring to FIG. 10E, in the second data line DL2, the second contact holes CH2 between the second fan-out line DL2b and the bridge BR, and the third contact holes CH3 between the bridge BR and the second link line DL2c may be provided with different numbers and different sizes at different positions in the plan view. In the illustrated exemplary embodiment, it is illustrated that the number of second contact holes CH2 is three and the number of third contact holes CH3 is six, for example. In the illustrated exemplary embodiment of the invention, the larger number of third contact holes CH3 than that of the second contact holes CH2 may be provided. When the third insulating layer INS3 includes an inorganic material, and the fourth insulating layer INS4 includes an organic material, resistance in the contact structure passing through the fourth insulating layer INS4 may be larger, and in order to efficiently decrease resistance, more contact holes in the fourth insulating layer INS4 may be defined.

Figure 10F:
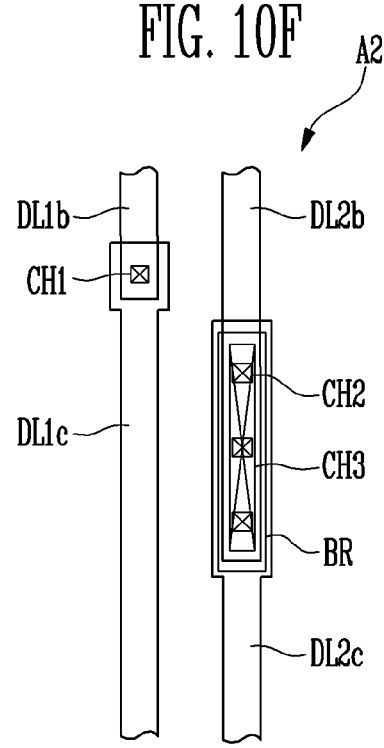

Referring to FIG. 10F, in the second data line DL2, the second contact holes CH2 between the second fan-out line DL2b and the bridge BR, and the third contact holes CH3 between the bridge BR and the second link line DL2c may be provided with different numbers and different sizes at different positions when viewed on the plane. In the illustrated exemplary embodiment, the number of third contact holes CH3 is smaller than the number of second contact holes CH2. However, an area of one of the third contact holes CH3 is larger than a sum of the areas of all of the second contact holes CH2. When the third insulating layer INS3 includes an inorganic material, and the fourth insulating layer INS4 includes an organic material, resistance in the contact structure passing through the fourth insulating layer INS4 may be larger, and in order to efficiently decrease resistance, the contact hole in the fourth insulating layer INS4 may be defined to have a larger area.

Figure 10G:
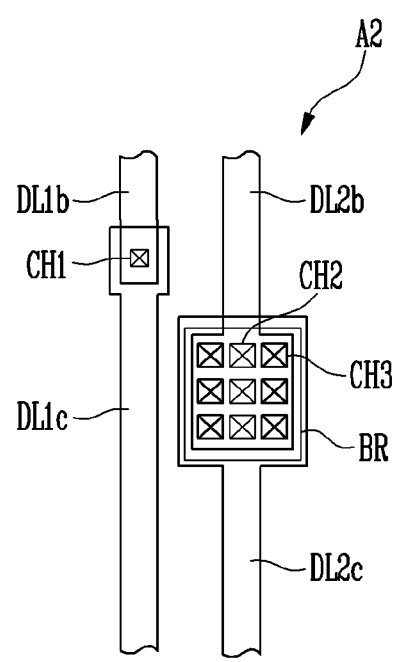

Referring to FIG. 10G in the second data line DL2, the second contact holes CH2 between the second fan-out line DL2b and the bridge BR, and the third contact holes CH3 between the bridge BR and the second link line DL2c have the same size when viewed on the plane, but may be provided with different number at different positions. In this case, the second contact holes CH2 and the third contact holes CH3 may be spaced apart from one another in the plan view. When the second contact holes CH2 and the third contact holes CH3 may be spaced apart from one another, a defect (for example, insufficient deposition, and an etching after image) caused by a large step generated by the overlapping of the contact holes is relatively prevented, so that a stable contact may be achieved.

In the drawings, it is illustrated that the contact structures of the first data line DL1 are the same, and the contact structures of the second data line DL2 are modified, but the invention is not limited thereto. As long as a deviation of resistance is decreased within the limit, in which the delay of the data signal between the first data line DL1 and the second data line DL2 is compensated, the contact structure of the first data line DL1 may also be modified by the similar method as a matter of course.

Figure 11:
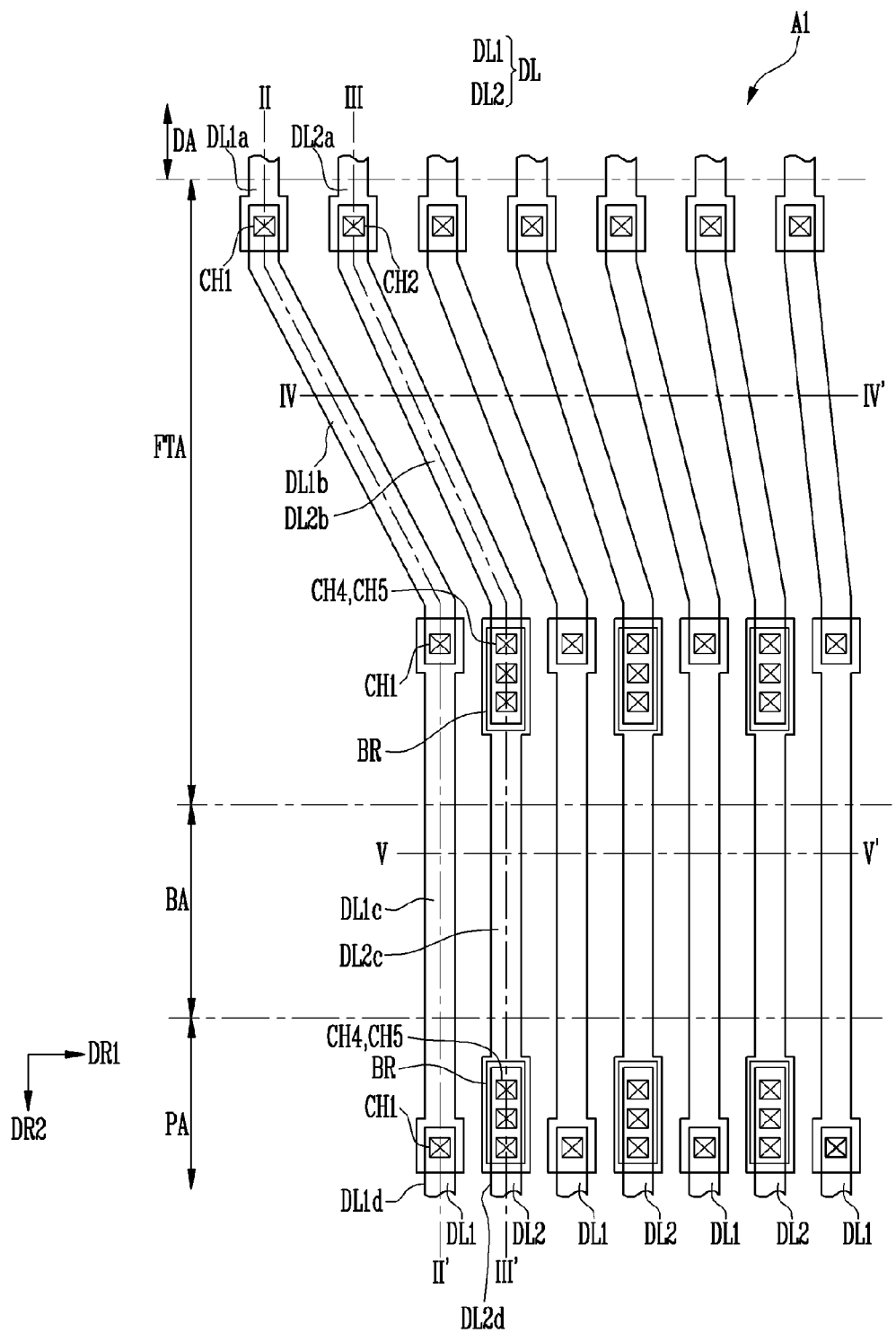
FIG. 11 is a plan view illustrating the exemplary embodiment of data lines in a portion corresponding to A1 of FIG. 2 in the display device according to the invention.
Figure 12A:
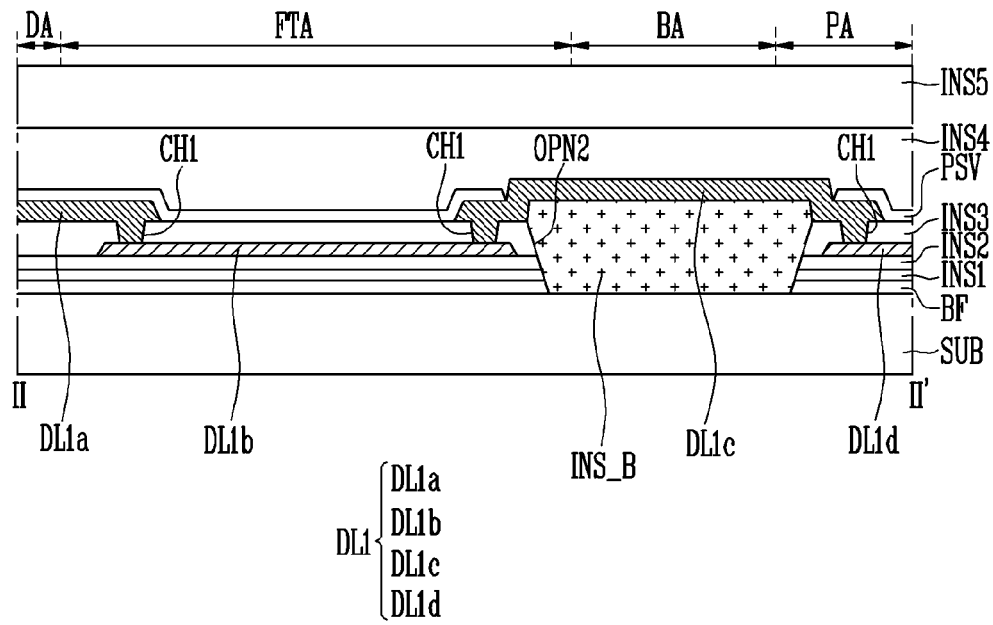
FIG. 12A is a cross-sectional view taken along line II-II' of FIG. 11.
Figure 12B:
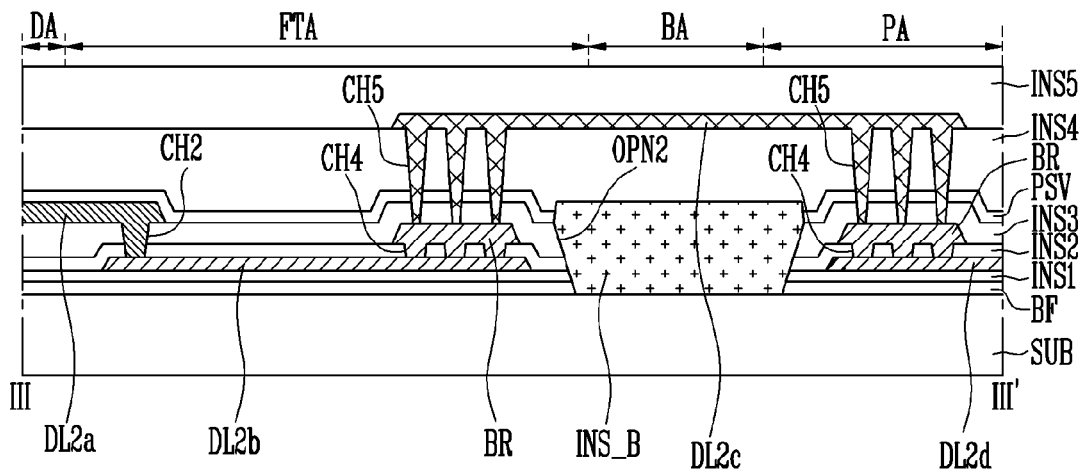
FIG. 12B is a cross-sectional view taken along line III-III' of FIG. 11.
Figure 12C:
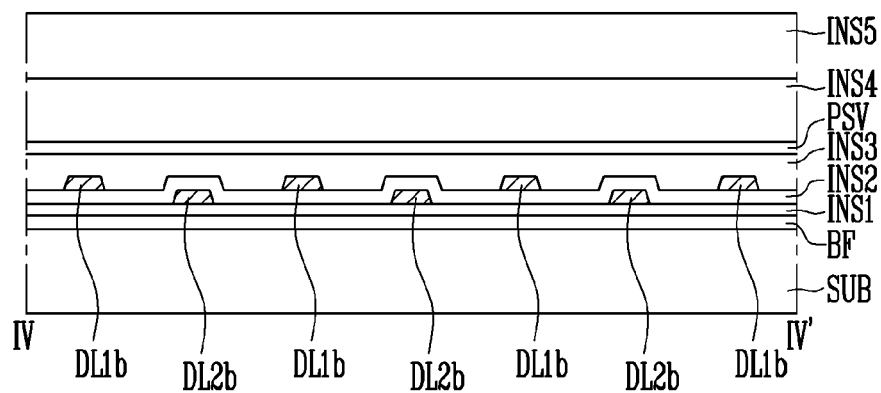
FIG. 12C is a cross-sectional view taken along line IV-IV' of FIG. 11.
Figure 12D:
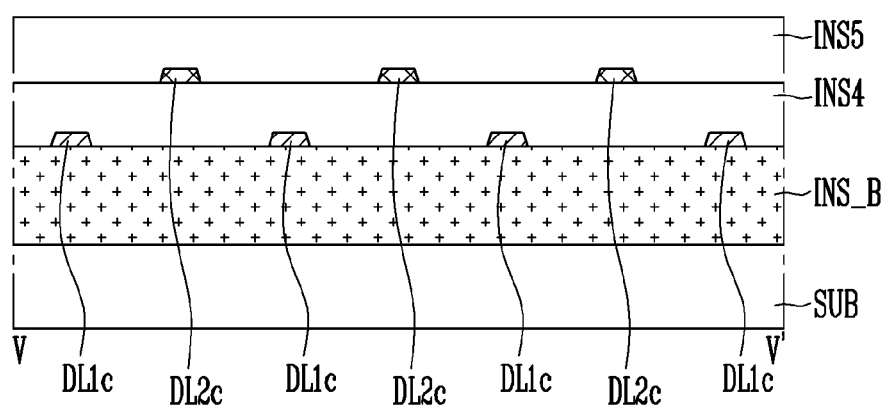
FIG. 12D is a cross-sectional view taken along line V-V' of FIG. 11.

According to an exemplary embodiment of the invention, the data lines may be provided in a different form from that of the aforementioned exemplary embodiment, and the bridge may be provided at a different position from that of the aforementioned exemplary embodiment. FIG. 11 is a plan view illustrating the data lines in a portion corresponding to A1 of FIG. 2 in the display device according to an exemplary embodiment of the invention. FIG. 12A is a cross-sectional view taken along line II-II' of FIG. 11, FIG. 12B is a cross-sectional view taken along line III-III' of FIG. 11, FIG. 12C is a cross-sectional view taken along line IV-IV' of FIG. 11, and FIG. 12D is a cross-sectional view taken along line V-V' of FIG. 11.

Referring to FIGS. 11, and 12A to 12D, the data lines DL include the first data lines DL1 connected to the first pixel column C1 (refer to FIGS. 3A and 3B) and the second data lines DL2 connected to the second pixel column C2 (refer to FIGS. 3A and 3B). Although not illustrated, the first pixels of the first color may be connected to the first pixel column C1, and the first color may be a green color. The second pixels of the second color and the third pixels of the third color may be connected to the second pixel column C2, and the second color and the third color may be a red color and a blue color.

The first data lines DL1 and the second data lines DL2 are provided in plural, and are alternately disposed in the second direction DR2.

Each first data line DL1 includes a first pixel unit data line DL1a provided in the display area DA, a first fan-out line DL1b provided in the fan-out area FTA, a first link line DL1c provided in the bent area BA, and a first connection line DL1d provided in the pad area PA.

The first data line DL1 is provided on the third insulating layer INS3 in the display area DA, is provided on the second insulating layer INS2 in the fan-out area FTA, is provided on the bent portion insulating layer INS_B in the bent area BA, and is provided on the second insulating layer INS2 in the pad area PA. Particularly, the first pixel unit data line DL1a is provided on the third insulating layer INS3 in the display area DA, the first fan-out line DL1b is provided on the second insulating layer INS2 in the fan-out area FTA, the first link line DL1c is provided on the bent portion insulating layer INS_B in the bent area BA, and the first connection line DL1d is provided on the second insulating layer INS2 in the pad area PA.

The third insulating layer INS3 is provided with the first contact hole CH1 which exposes a part of an upper surface of the first fan-out line DL1b and a part of the first connection line DL1d. The first pixel unit data line DL1a and the first link line DL1c are connected to the first fan-out line DL1b and the first connection line DL1d through the first contact holes CH1.

Each second data line DL2 includes a second pixel unit data line DL2a provided in the display area DA, a second fan-out line DL2b provided in the fan-out area FTA, a second link line DL2c provided in the bent area BA, a second connection line DL2d provided in the pad area PA, and a bridge BR provided in the fan-out area FTA and the pad area PA.

The second data line DL2 is provided on the third insulating layer INS3 in the display area DA, is provided on the first insulating layer INS1 in the fan-out area FTA, is provided on the fourth insulating layer INS4 in the bent area BA, and is provided on the first insulating layer INS1 in the pad area PA. Particularly, the second pixel unit data line DL2a is provided on the third insulating layer INS3 in the display area DA, the second fan-out line DL2b is provided on the first insulating layer INS1 in the fan-out area FTA, the second link line DL2c is provided on the fourth insulating layer INS4 in the bent area BA, the second connection line DL2d is provided on the first insulating layer INS1 in the pad area PA, and the bridges BR are provided on the second insulating layer INS2.

The second insulating layer INS2 and the third insulating layer INS3 corresponding to one end of the second fan-out line DL2b are provided with the second contact holes CH2, which expose an upper surface of the second fan-out line DL2b. The second insulating layer INS2 corresponding to the other end of the second fan-out line DL2b and one end of the second connection line DL2d is provided with fourth contact holes CH4, which expose the upper surface of the second fan-out line DL2b. The third insulating layer INS3, the passivation layer PSV, and the fourth insulating layer INS4 are provided with fifth contact holes CH5, which partially expose the upper surfaces of the bridges BR.

The second pixel unit data line DL2a and the second fan-out line DL2b are connected to each other through the second contact hole CH2. The second fan-out line DL2b and the second link line DL2c are connected to each other through the bridge BR, so that the second fan-out line DL2b and the bridge BR are connected to each other through the fourth contact hole CH4, and the bridge BR and the second link line DL2c are connected to each other through the fifth contact hole CH5. The second link line DL2c and the second connection line DL2d are connected to each other through the bridge BR, so that the second link line DL2c and the bridge BR are connected to each other through the fifth contact hole CH5, and the bridge BR and the second connection line DL2d are connected to each other through the fourth contact hole CH4.

According to an exemplary embodiment of the invention, the data lines may be provided in a different form from that of the aforementioned exemplary embodiment, and the bridge may be omitted unlike the aforementioned exemplary embodiment.

Figure 13:
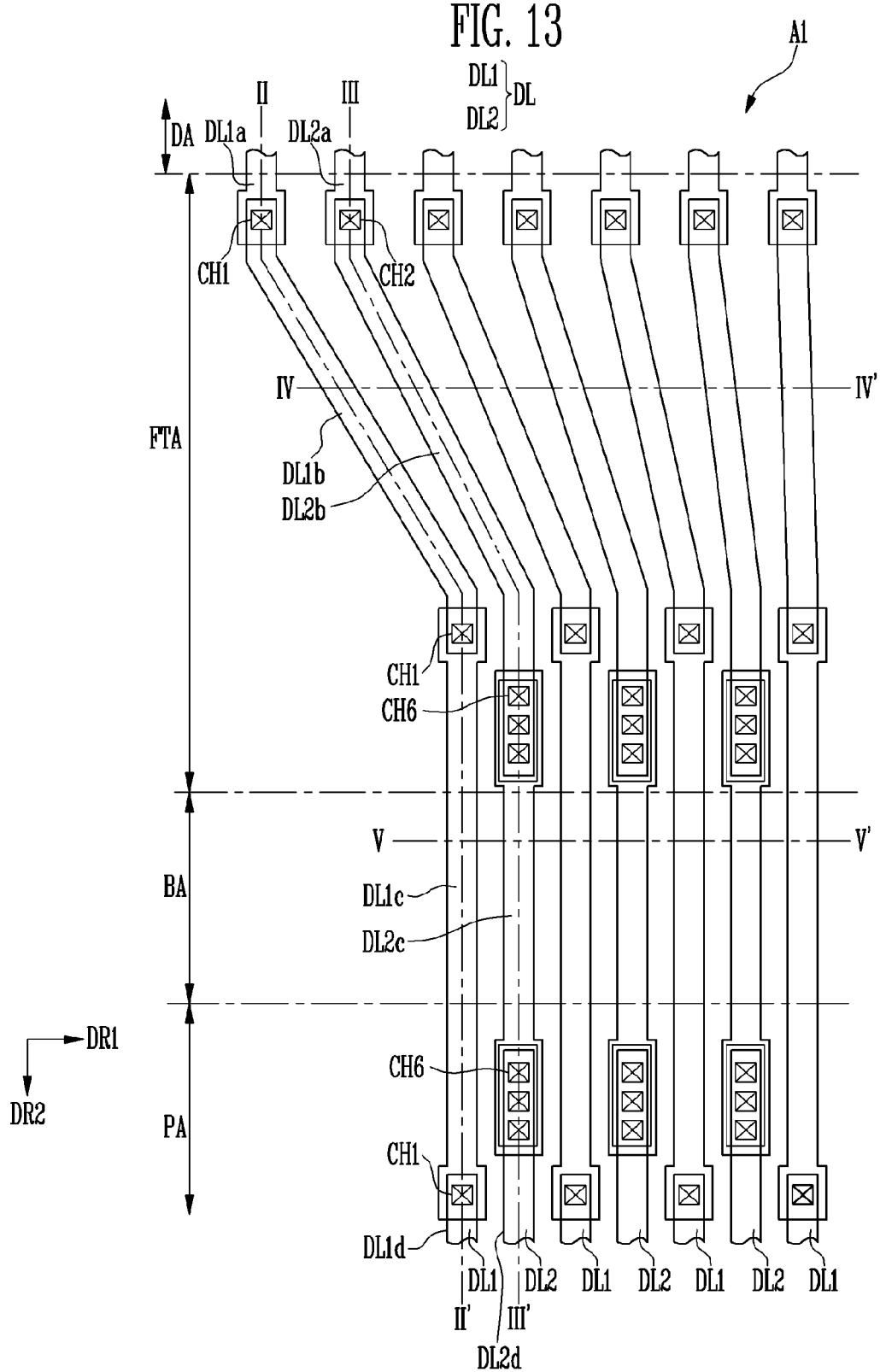
FIG. 13 is a plan view illustrating the exemplary embodiment of data lines in a portion corresponding to A1 of FIG. 2 in the display device according to the invention.
Figure 14A:
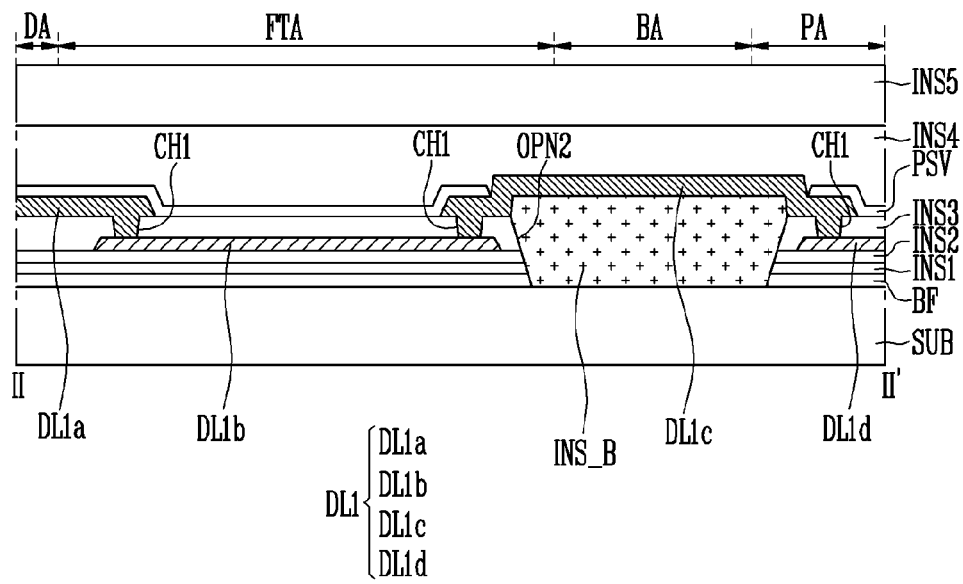
FIG. 14A is a cross-sectional view taken along line II-II' of FIG. 13.
Figure 14B:
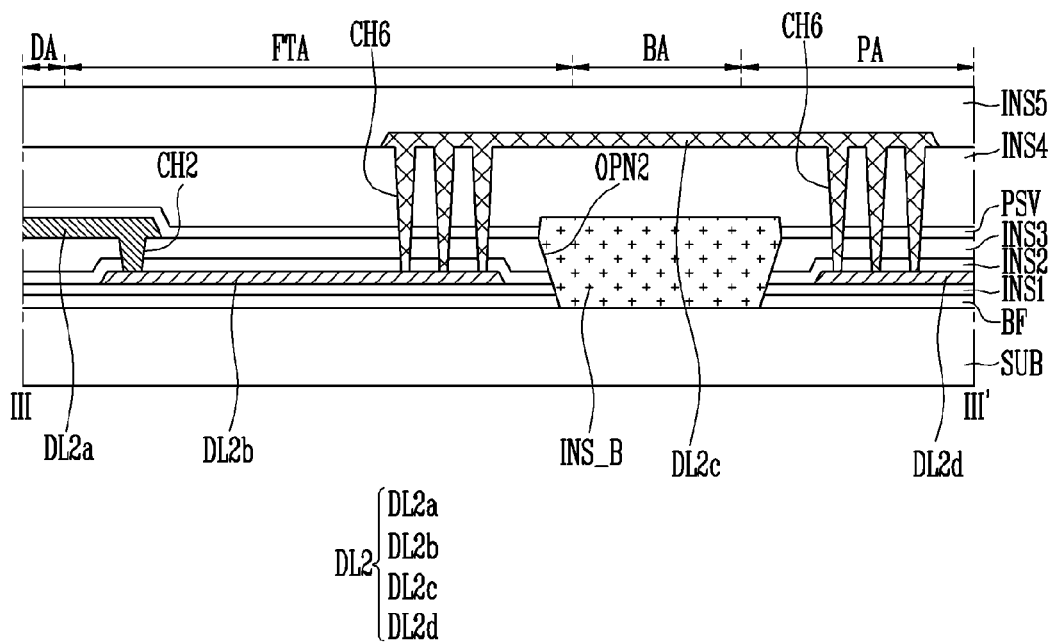
FIG. 14B is a cross-sectional view taken along line III-III' of FIG. 13.
Figure 14C:
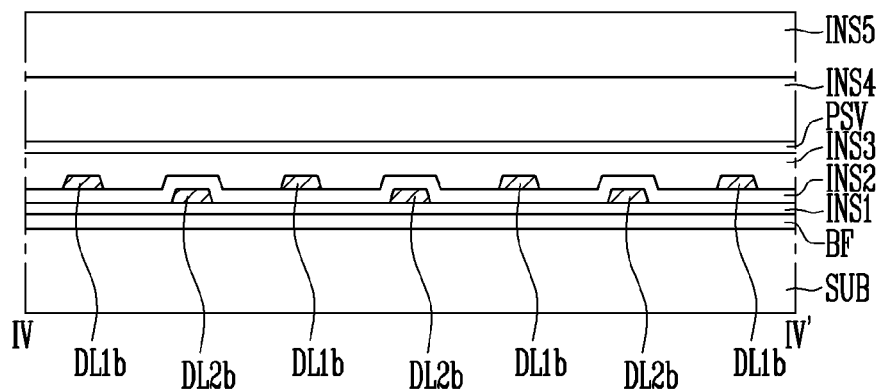
FIG. 14C is a cross-sectional view taken along line IV-IV' of FIG. 13.
Figure 14D:
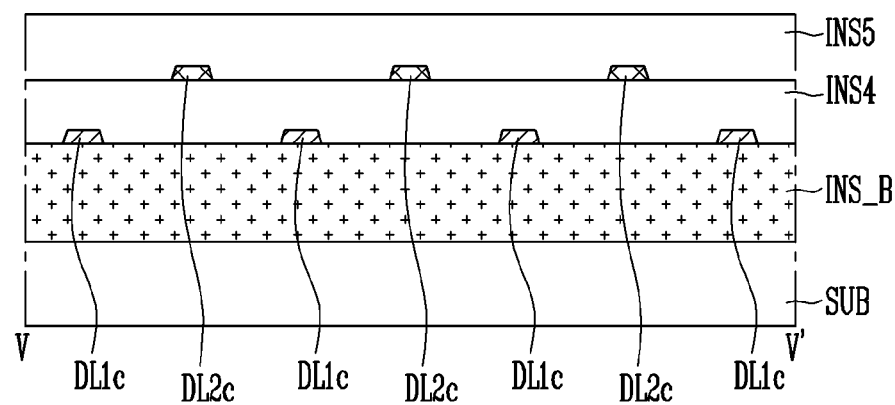
FIG. 14D is a cross-sectional view taken along line V-V' of FIG. 13.

FIG. 13 is a plan view illustrating data lines in a portion corresponding to A1 of FIG. 2 in the display device according to an exemplary embodiment of the invention. FIG. 14A is a cross-sectional view taken along line II-II' of FIG. 13, FIG. 14B is a cross-sectional view taken along line III-III' of FIG. 13, FIG. 14C is a cross-sectional view taken along line IV-IV' of FIG. 13, and FIG. 14D is a cross-sectional view taken along line V-V' of FIG. 13.

Referring to FIGS. 13, and 14A to 14D, the first data lines DL1 and the second data lines DL2 are provided in plural, and are alternately disposed in the second direction DR2.

Each first data line DL1 includes a first pixel unit data line DL1a provided in the display area DA, a first fan-out line DL1b provided in the fan-out area FTA, a first link line DL1c provided in the bent area BA, and a first connection line DL1d provided in the pad area PA.

The first data line DL1 is provided on the third insulating layer INS3 in the display area DA, is provided on the second insulating layer INS2 in the fan-out area FTA, is provided on the bent portion insulating layer INS_B in the bent area BA, and is provided on the second insulating layer INS2 in the pad area PA. Particularly, the first pixel unit data line DL1a is provided on the third insulating layer INS3 in the display area DA, the first fan-out line DL1b is provided on the second insulating layer INS2 in the fan-out area FTA, the first link line DL1c is provided on the bent portion insulating layer INS_B in the bent area BA, and the first connection line DL1d is provided on the second insulating layer INS2 in the pad area PA.

The third insulating layer INS3 is provided with the first contact hole CH1 which exposes a part of an upper surface of the first fan-out line DL1b and a part of the first connection line DL1d. The first pixel unit data line DL1a and the first link line DL1c are connected to the first fan-out line DL1b and the first connection line DL1d through the first contact holes CH1.

Each second data line DL2 includes a second pixel unit data line DL2a provided in the display area DA, a second fan-out line DL2b provided in the fan-out area FTA, a second link line DL2c provided in the bent area BA, and a second connection line DL2d provided in the pad area PA.

The second data line DL2 is provided on the third insulating layer INS3 in the display area DA, is provided on the first insulating layer INS1 in the fan-out area FTA, is provided on the fourth insulating layer INS4 in the bent area BA, and is provided on the first insulating layer INS1 in the pad area PA. Particularly, the second pixel unit data line DL2a is provided on the third insulating layer INS3 in the display area DA, the second fan-out line DL2b is provided on the first insulating layer INS1 in the fan-out area FTA, the second link line DL2c is provided on the fourth insulating layer INS4 in the bent area BA, the second connection line DL2d is provided on the first insulating layer INS1 in the pad area PA.

The second insulating layer INS2 and the third insulating layer INS3 corresponding to one end of the second fan-out line DL2b are provided with the second contact holes CH2, which expose an upper surface of the second fan-out line DL2b. The second insulating layer INS2, the third insulating layer INS3, the passivation layer PSV, and the fourth insulating layer INS4 corresponding to the other end of the second fan-out line DL2b and one end of the second connection line DL2d is provided with sixth contact holes CH6, which expose the upper surface of the second fan-out line DL2b.

The second pixel unit data line DL2a and the second fan-out line DL2b are connected to each other through the second contact hole CH2. The second fan-out line DL2b and the second link line DL2c are connected to each other through the sixth contact hole CH6. The second link line DL2c and the second connection line DL2d are connected to each other through the sixth contact hole CH6.

Figure 15:
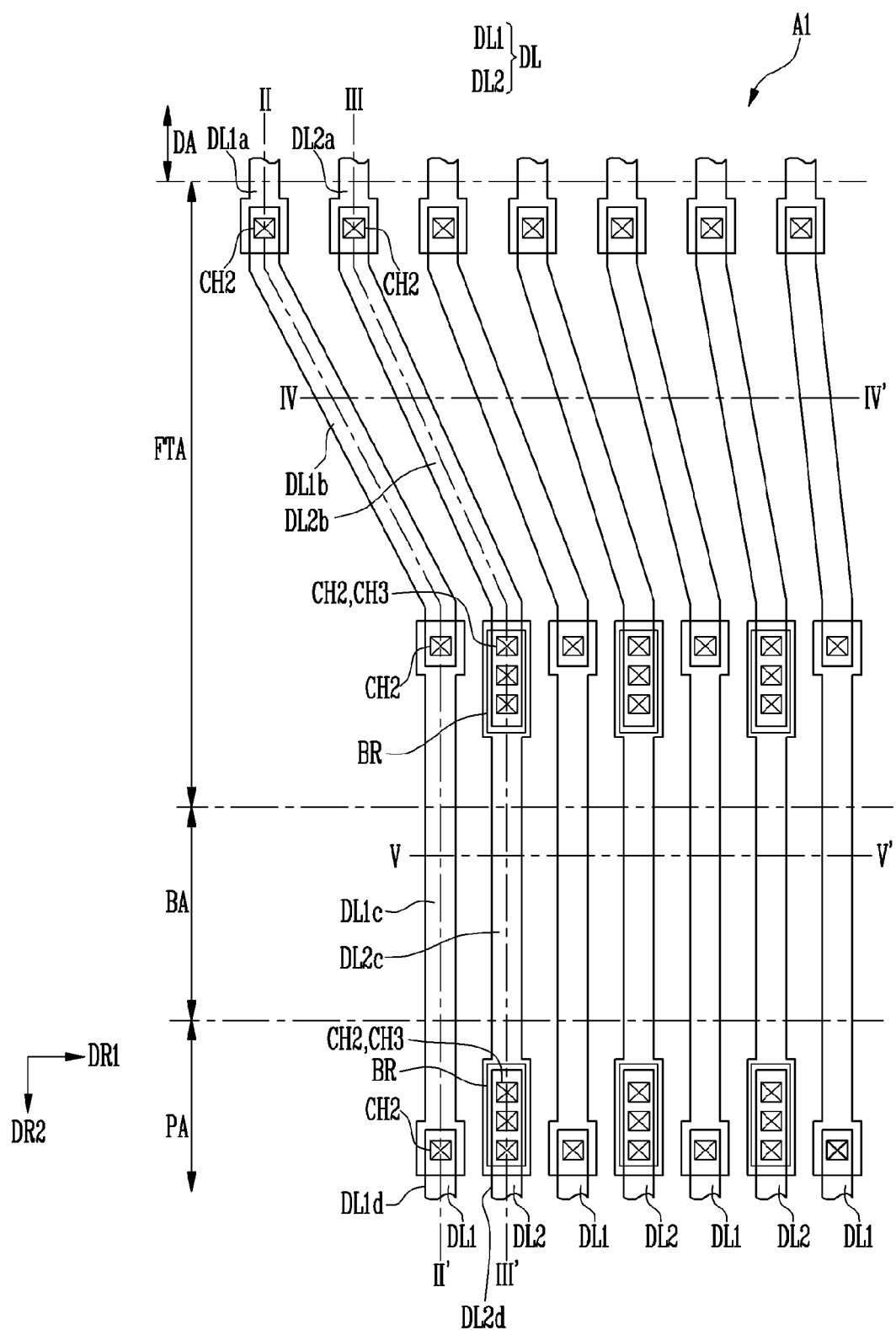
FIG. 15 is a plan view illustrating the exemplary embodiment of data lines in a portion corresponding to A1 of FIG. 2 in the display device according to the invention.
Figure 16A:
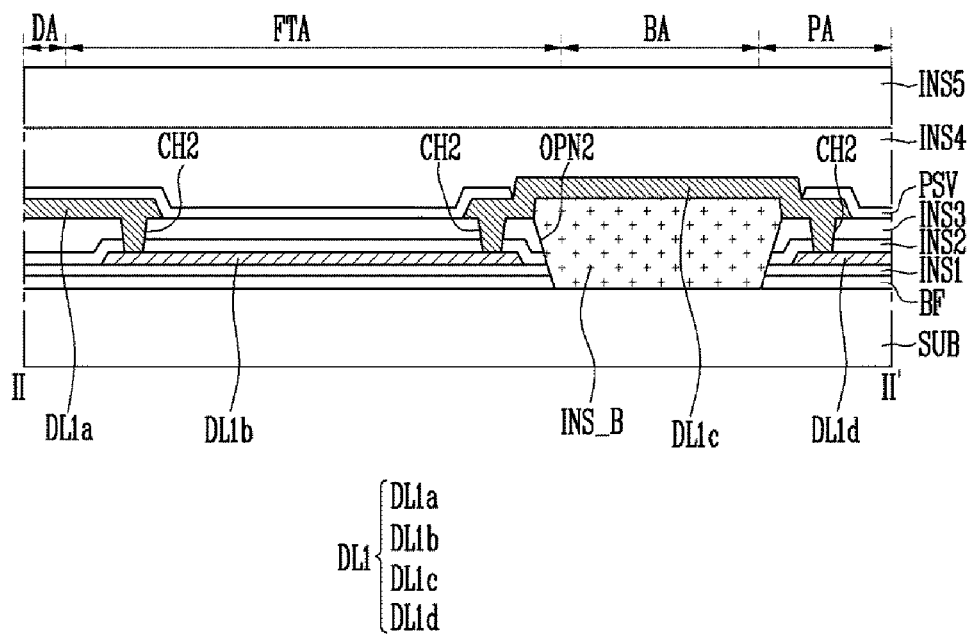
FIG. 16A is a cross-sectional view taken along line II-II' of FIG. 15.
Figure 16B:
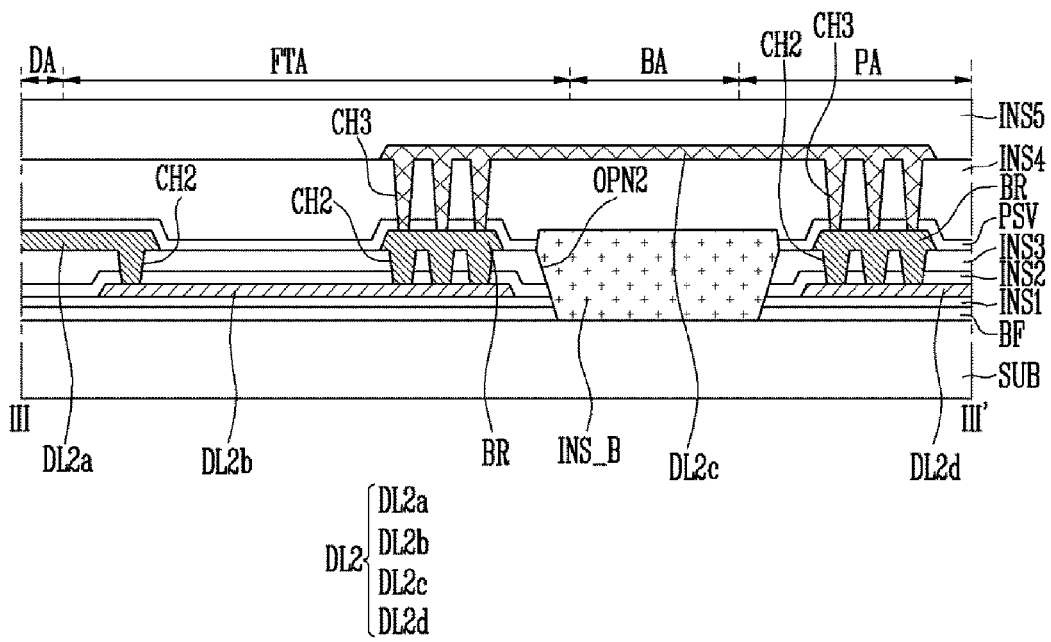
FIG. 16B is a cross-sectional view taken along line III-III' of FIG. 15.
Figure 16C:
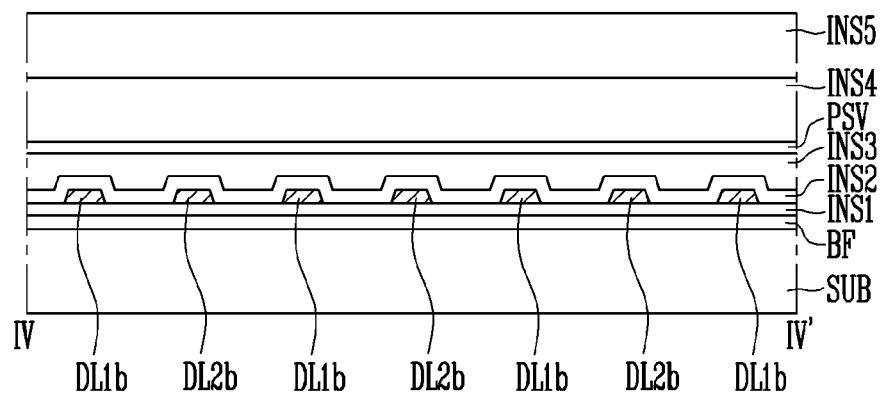
FIG. 16C is a cross-sectional view taken along line IV-IV' of FIG. 15.
Figure 16D:
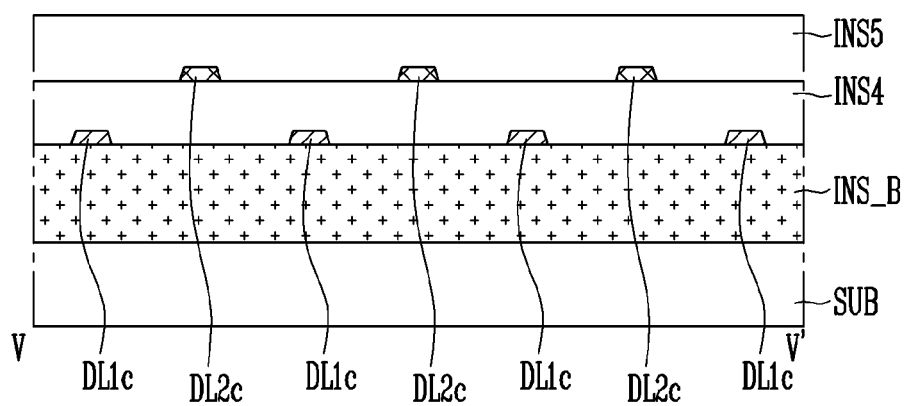
FIG. 16D is a cross-sectional view taken along line V-V' of FIG. 15.

According to an exemplary embodiment of the invention, the data lines may be provided in a different form from that of the aforementioned exemplary embodiment, and some of the data lines may be provided on a different layer. FIG. 15 is a plan view illustrating the data lines in a portion corresponding to A1 of FIG. 2 in the display device according to an exemplary embodiment of the invention. FIG. 16A is a cross-sectional view taken along line II-II' of FIG. 15, FIG. 16B is a cross-sectional view taken along line III-III' of FIG. 15, FIG. 16C is a cross-sectional view taken along line IV-IV' of FIG. 15, and FIG. 16D is a cross-sectional view taken along line V-V' of FIG. 15.

Referring to FIGS. 15, and 16A to 16D, the first data lines DL1 and the second data lines DL2 are provided in plural, and are alternately disposed in the second direction DR2.

Each first data line DL1 includes a first pixel unit data line DL1a provided in the display area DA, a first fan-out line DL1b provided in the fan-out area FTA, a first link line DL1c provided in the bent area BA, and a first connection line DL1d provided in the pad area PA.

The first data line DL1 is provided on the third insulating layer INS3 in the display area DA, is provided on the first insulating layer INS1 in the fan-out area FTA, is provided on the bent portion insulating layer INS_B in the bent area BA, and is provided on the first insulating layer INS1 in the pad area PA. Particularly, the first pixel unit data line DL1a is provided on the third insulating layer INS3 in the display area DA, the first fan-out line DL1b is provided on the first insulating layer INS1 in the fan-out area FTA, the first link line DL1c is provided on the bent portion insulating layer INS_B in the bent area BA, and the first connection line DL1d is provided on the first insulating layer INS1 in the pad area PA.

The second insulating layer INS2 and the third insulating layer INS3 are provided with the second contact holes CH2, which exposes a part of an upper surface of the first fan-out line DL1b and a part of the first connection line DL1d. The first pixel unit data line DL1a and the first link line DL1c are connected to the first fan-out line DL1b and the first connection line DL1d through the second contact holes CH2.

Each second data line DL2 includes a second pixel unit data line DL2a provided in the display area DA, a second fan-out line DL2b provided in the fan-out area FTA, a second link line DL2c provided in the bent area BA, and a second connection line DL2d provided in the pad area PA.

The second data line DL2 is provided on the third insulating layer INS3 in the display area DA, is provided on the first insulating layer INS1 in the fan-out area FTA, is provided on the fourth insulating layer INS4 in the bent area BA, and is provided on the first insulating layer INS1 in the pad area PA. Particularly, the second pixel unit data line DL2a is provided on the third insulating layer INS3 in the display area DA, the second fan-out line DL2b is provided on the first insulating layer INS1 in the fan-out area FTA, the second link line DL2c is provided on the fourth insulating layer INS4 in the bent area BA, the second connection line DL2d is provided on the first insulating layer INS1 in the pad area PA, and the bridges BR are provided on the third insulating layer INS3.

The second insulating layer INS2 and the third insulating layer INS3 are provided with the second contact holes CH2, which partially expose an upper surface of the second fan-out line DL2b and an upper surface of the second connection line DL2d. The passivation layer PSV and the fourth insulating layer INS4 are provided with the third contact holes CH3, which partially expose the upper surfaces of the bridges BR. The second pixel unit data line DL2a and the second fan-out line DL2b are connected to each other through the second contact hole CH2. The second fan-out line DL2b and the second link line DL2c are connected to each other through the bridge BR, so that the second fan-out line DL2b and the bridge BR are connected through the second contact hole CH2, and the bridge BR and the second link line DL2c are connected to each other through the third contact hole CH3. The second link line DL2c and the second connection line DL2d are connected to each other through the bridge BR, so that the second link line DL2c and the bridge BR are connected to each other through the third contact hole CH3, and the bridge BR and the second connection line DL2d are connected to each other through the second contact hole CH2.

In the illustrated exemplary embodiment, the first fan-out lines DL1b of the first data lines DL1 and the second fan-out lines DL2b of the second data lines DL2 are provided on the same layer, and are alternately disposed on the plane. All of the first fan-out lines DL1b and the second fan-out lines DL2b are disposed on the first insulating layer INS1.

In the illustrated exemplary embodiments, it is illustrated that the first data line DL1 and the second data line DL2 have the same width, but the invention is not limited thereto. In an exemplary embodiment of the invention, the first data line DL1 and the second data line DL2 may have different widths in the non-display area. In an exemplary embodiment, the second fan-out line DL2b provided in the fan-out area FTA may have a larger width than that of the first fan-out line DL1b. The second fan-out line DL2b has a larger width than that of the first fan-out line DL1b, so that resistance of the second fan-out line DL2b may be decreased to be lower than resistance of the first fan-out line DL1b.

The display device having the aforementioned structure decreases a deviation of a delay of a data signal between the first data line and the second data line, thereby decreasing a defect generable due to the deviation of the delay of the data signal. That is, in an exemplary embodiment of the invention, the resistance of the second data lines connected to the red pixel and the blue pixel are provided to be relatively lower than the resistance of the first data line connected to the green pixel, and the degrees of delay of the data signals applied to the second data line and the first data line are matched, thereby preventing a vertical line defect and a greenish defect.

The display device according to an exemplary embodiment of the invention may be applied to various electronic devices. In an exemplary embodiment, the display device may be applied to a television, a notebook computer, a mobile phone, a smart phone, a smart pad ("PD"), a portable multimedia player ("PDP"), a personal digital assistant ("PDA"), a navigation device, various wearable devices, such as a smart watch, and the like.

Although the invention has been described with reference to the exemplary embodiments, those skilled in the art may understand that the invention may be variously modified and changed within a scope without departing from the spirit and the area of the invention described in the accompanying claims. The parts described as the respective exemplary embodiments may be combined with one another without departing from the concept of the invention, for example. Further, a part of one exemplary embodiment and a part of another exemplary embodiment may be exchanged.

Accordingly, the technical scope of the invention is not limited to the contents described in the detailed description of the specification, but shall be defined by the claims.

What is claimed is:

1. A display device, comprising:
a substrate including a display area and a non-display area;
a pixel unit provided in the display area, and including a first pixel column including a plurality of pixels and a second pixel column including a plurality of pixels which displays a different color from a color of the first pixel column; and
data lines which are respectively connected to the first pixel column and the second pixel column, and respectively apply data signals to the first pixel column and the second pixel column,
wherein the data line connected to the first pixel column includes sub lines and the data line connected to the second pixel column includes sub lines,
in the non-display area, the sub lines connected to the first pixel column are connected with one another through at least one first contact hole, the sub lines connected to the second pixel column are connected with one another through at least one second contact hole, and the sub lines connected to the second pixel column are connected through the at least one second contact hole having a larger area than an area of the at least one first contact hole, through which the sub lines connected to the first pixel column are connected with one another, and
wherein a resistance of the data line connected to the first pixel column is provided to be relatively larger than a resistance of the sub lines connected to the second pixel column.

2. A display device, comprising:
a substrate including a display area and a non-display area;
a pixel unit provided in the display area, and including a first pixel column including a plurality of pixels and a second pixel column including a plurality of pixels which displays a different color from a color of the first pixel column; and
data lines which are respectively connected to the first pixel column and the second pixel column, and respectively apply data signals to the first pixel column and the second pixel column,
wherein the data line connected to the first pixel column includes sub lines and the data line connected to the second pixel column includes sublines,
in the non-display area, the sub lines connected to the first pixel column are connected with one another through at least one first contact hole, the sub lines connected to the second pixel column are connected with one another through at least one second contact hole, and the sub lines connected to the second pixel column are connected through a larger number of the at least one second contact hole than a number of the at least one first contact hole, through which the sub lines connected to the first pixel column are connected with one another, and
wherein a resistance of the data line connected to the first pixel column is provided to be relatively larger than a resistance of the sub lines connected to the second pixel column.

3. The display device of claim 2, wherein a first sub line and a second sub line of the sub lines are connected with each other through a first contact hole provided between the first sub line and the second sub line, and
a third sub line and a fourth sub line of the sub lines are connected with each other through a second contact hole provided between the third sub line and the fourth sub line.

4. The display device of claim 3, wherein an area of the second contact hole is larger than an area of the first contact hole.

5. The display device of claim 3, wherein a number of second contact holes is larger than a number of first contact holes.

6. The display device of claim 3, wherein the second data line further includes a bridge provided between the third and fourth sub lines.

7. The display device of claim 6, wherein the first sub line and the second sub line are connected with each other through a first contact hole provided between the first sub line and the second sub line, and
the third sub line, the bridge, and the fourth sub line are connected with one another through at least one second contact hole provided between the third sub line and the bridge and at least one third contact hole provided between the bridge and the fourth sub line.

8. The display device of claim 7, wherein the second contact hole and the third contact hole at least partially overlap in a plan view.

9. The display device of claim 7, wherein an area of the second contact hole is different from an area of the third contact hole.

10. The display device of claim 9, wherein an area of the third contact hole is larger than an area of the second contact hole.

11. The display device of claim 7, wherein a number of second contact holes is larger than a number of third contact holes.

12. The display device of claim 7, wherein a number of third contact holes is larger than a number of second contact holes.

13. The display device of claim 2, further comprising:
first to fourth insulating layers sequentially stacked on the substrate,
wherein the data lines include first data lines connected to the first pixel column and second data lines connected to the second pixel column, and
at least a part of the first data lines and the second data lines are provided on at least two layers among the first to fourth insulating layers.

14. The display device of claim 13, wherein the non-display area includes a fan-out area, a bent area, and a pad area sequentially disposed from the display area.

15. The display device of claim 14, wherein in the fan-out area, a first data line of the first data lines is provided on one of the first and second insulating layers, and a second data line of the second data lines is provided on a remainder of the first and second insulating layers.

16. The display device of claim 14, further comprising:
a bent insulating layer provided in the bent area,
wherein an opening is defined in the first to third insulating layers in the bent area, and the bent insulating layer is provided in the opening.

17. The display device of claim 16, wherein in the bent area, the first data line is provided on the bent insulating layer, and the second data line is provided on the fourth insulating layer.

18. The display device of claim 17, wherein the first to third insulating layers include an inorganic material, and the fourth insulating layer includes an organic material.

19. The display device of claim 1, wherein the pixel unit provided in the display area is defined by a plurality of the first pixel column and the second pixel column consecutively arranged next to each other in a row direction substantially perpendicular to a column direction in which each of the plurality of pixels in each of the first and second pixel columns are arranged.

20. The display device of claim 2, wherein the pixel unit provided in the display area is defined by a plurality of the first pixel column and the second pixel column consecutively arranged next to each other in a row direction substantially perpendicular to a column direction in which each of the plurality of pixels in each of the first and second pixel columns are arranged.

* * * * *